(12) United States Patent
Yoshioka et al.

(10) Patent No.: US 7,262,458 B2
(45) Date of Patent: *Aug. 28, 2007

(54) SEMICONDUCTOR MEMORY DEVICE AND PORTABLE ELECTRONIC APPARATUS

(75) Inventors: Fumiyoshi Yoshioka, Tenri (JP); Akihide Shibata, Nara (JP); Hiroshi Iwata, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 205 days.

This patent is subject to a terminal disclaimer.

(21) Appl. No.: 10/844,471

(22) Filed: May 13, 2004

(65) Prior Publication Data

US 2004/0227177 A1    Nov. 18, 2004

(30) Foreign Application Priority Data

May 16, 2003    (JP) .............................. 2003-139290

(51) Int. Cl.
*H01L 29/788* (2006.01)

(52) U.S. Cl. ...................... 257/324; 257/314; 257/315; 257/321; 257/E29.129

(58) Field of Classification Search ......... 257/314–326
See application file for complete search history.

(56) References Cited

U.S. PATENT DOCUMENTS

| | | | | |
|---|---|---|---|---|
| 5,614,748 | A * | 3/1997 | Nakajima et al. | 257/316 |
| 5,838,041 | A * | 11/1998 | Sakagami et al. | 257/324 |
| 6,335,554 | B1 * | 1/2002 | Yoshikawa | 257/316 |
| 6,489,649 | B2 * | 12/2002 | Kobayashi et al. | 257/314 |
| 6,646,916 | B2 * | 11/2003 | Kamei | 365/185.11 |
| 6,706,599 | B1 * | 3/2004 | Sadd et al. | 438/261 |
| 6,740,927 | B1 * | 5/2004 | Jeng | 257/315 |
| 6,911,691 | B2 * | 6/2005 | Tomiie et al. | 257/324 |
| 7,095,077 | B2 * | 8/2006 | Kataoka et al. | 257/324 |
| 2002/0179964 | A1 * | 12/2002 | Kato et al. | 257/316 |
| 2003/0075755 | A1 * | 4/2003 | Yamazaki | 257/315 |
| 2003/0160280 | A1 * | 8/2003 | Yoshino | 257/324 |
| 2003/0178671 | A1 * | 9/2003 | Takahashi | 257/315 |
| 2004/0183106 | A1 * | 9/2004 | Kim et al. | 257/239 |

FOREIGN PATENT DOCUMENTS

JP    63204770    8/1988

(Continued)

*Primary Examiner*—B. William Baumeister
*Assistant Examiner*—Matthew W. Such
(74) *Attorney, Agent, or Firm*—Birch, Stewart, Kolasch & Birch, LLP

(57) ABSTRACT

A semiconductor memory device includes: a gate electrode formed on a semiconductor layer via a gate insulating film; a channel region disposed under the gate electrode; diffusion regions disposed on both sides of the channel region and having a conductive type opposite to that of the channel region; and memory functional units formed on both sides of the gate electrode and having the function of retaining charges, wherein each of the diffusion regions has: a high-concentration impurity region disposed so as to be offset from the gate electrode; and a low-concentration impurity region disposed in contact with the high-concentration impurity region so as to overlap with the gate electrode, and an amount of current flowing from one of the diffusion regions to the other diffusion region is changed when a voltage is applied to the gate electrode in accordance with an amount of charges retained in the memory functional units.

15 Claims, 16 Drawing Sheets

FOREIGN PATENT DOCUMENTS

| | | |
|---|---|---|
| JP | 5-304-277 A | 11/1993 |
| JP | 5-81072 B2 | 11/1993 |
| JP | 9-116119 A | 5/1997 |
| JP | 2001-156188 A | 6/2001 |
| JP | 2001-230332 A | 8/2001 |
| JP | 2001-512290 A | 8/2001 |

* cited by examiner

SEMICONDUCTOR MEMORY DEVICE AND PORTABLE ELECTRONIC APPARATUS

CROSS-REFERENCE TO RELATED APPLICATION

This application is related to Japanese application No. 2003-139290 filed on May 16, 2003, whose priority is claimed under 35 USC §119 the disclosure of which is incorporated by reference in its entirety.

BACKGROUND OF THE INVENTION

1. Field of the Invention

The present invention relates to a semiconductor memory device and a portable electronic apparatus having the semiconductor memory device. More specifically, the present invention relates to a semiconductor memory device constructed by field-effect transistors each including a memory functional unit having the function of retaining charges, and to a portable electronic apparatus having the semiconductor memory device.

2. Description of the Related Art

As a representative of conventional nonvolatile memories, a flash memory will be described below (Japanese Unexamined Patent Publication No. HEI 5(1993)-304277). FIG. 26 is a schematic sectional view showing an example of a flash memory cell. Shown in FIG. 26 are a semiconductor substrate 901, a floating gate 902, a word line (control gate) 903, a diffusion layer source line 904, a diffusion layer bit line 905, a device isolation region 906 and an insulating film 907.

A flash memory cell has a floating gate, and information is held according to an amount of charges in the floating gate. In a memory cell array constructed by arranging memory cells, an operation of rewriting/reading a desired memory cell can be performed by selecting a specific word line and a specific bit line and applying a predetermined voltage.

FIG. 27 is a graph schematically showing a drain current (Id)-gate voltage (Vg) characteristic when an amount of charges in the floating gate in the flash memory changes. When the amount of negative charges in the floating gate increases, the threshold increases and the Id-Vg curve moves almost in parallel in the Vg increasing direction.

In the conventional flash memory, where, a floating gate exists between a word line (gate electrode) and a channel region, it is difficult to reduce the thickness of an insulating film separating the floating gate and the word line and the thickness of an insulating film separating the floating gate and the channel region in order to prevent leakage of charges from the floating gate. Consequently, it is difficult to effectively reduce the thickness of the gate insulating film, and it disturbs reduction in size of the memory cell.

SUMMARY OF THE INVENTION

The present invention has been achieved in consideration of the problems and provides, in its various embodiments, a fine nonvolatile memory.

According to a first aspect of the present invention, it is provided a semiconductor memory device comprising:

a gate electrode formed on a semiconductor layer via a gate insulating film;

a channel region disposed under the gate electrode;

diffusion regions disposed on both sides of the channel region and having a conductive type opposite to that of the channel region; and memory functional units formed on both sides of the gate electrode and having the function of retaining charges, wherein each of the diffusion regions has:

a high-concentration impurity region disposed so as to be offset from the gate electrode; and a low-concentration impurity region disposed in contact with the high-concentration impurity region so as to overlap with the gate electrode, and an amount of current flowing from one of the diffusion regions to the other diffusion region is changed when a voltage is applied to the gate electrode in accordance with an amount of charges retained in the memory functional units.

The semiconductor memory device with the configuration can operate as a memory cell by converting a change in the amount of charges in the memory functional unit into a current amount. Since the two memory functional units formed on both sides of the gate electrode are independent of the gate insulating film, a memory function of the memory functional unit and a transistor operation function of the gate insulating film are separated from each other. Consequently, it is easy to reduce the thickness of the gate insulating film and suppress the short channel effect while maintaining the sufficient memory function.

Since two memory functional units formed on both sides of the gate electrode are separated from each other, interference which occurs at the time of rewriting can be effectively suppressed. In other words, the distance between the two memory functional units can be made short. Therefore, a semiconductor memory device which can perform an operation of retaining information of two or more bits per one transistor and of which size is easily reduced can be realized.

Further, each of the diffusion regions is constructed by the high-concentration impurity region and the low-concentration impurity region, and the low-concentration impurity region overlaps with the gate electrode. Therefore, variations in the reading characteristic of the memory cells can be largely suppressed.

Further, in the semiconductor memory device according to the first aspect, the impurity concentration of the low-concentration impurity region can be set to the range from $1 \times 10^{15}$ cm$^{-3}$ to $1 \times 10^{18}$ cm$^{-3}$.

By setting the range of the impurity concentration as described above, while stably forming the low-concentration impurity region, the difference between the drain current at the time of writing and the drain current at the time of erasing can be made larger.

In the semiconductor memory device according to the first aspect, the thickness of the low-concentration impurity region can be set to the range from 1 nm to 50 nm.

By setting the range of the thickness as described above, while preventing resistance of the diffusion region from remarkably increasing and the drain current from decreasing, the difference between the drain current at the time of writing and the drain current at the time of erasing can be made larger.

According to a second aspect of the present invention, provided is a semiconductor memory device including:

a gate electrode formed on a semiconductor layer via a gate insulating film;

a channel region disposed under the gate electrode;

diffusion regions disposed on both sides of the channel region and having a conductive type opposite to that of the channel region; and memory functional units formed on both sides of the gate electrode and having the function of retaining charges, wherein a part of the diffusion region exists at a level higher than the level of an interface between the gate insulating film and the semiconductor layer, the diffusion region overlaps with the gate electrode, and an amount of current flowing from one of the diffusion regions to the other diffusion region when a voltage is applied to the gate electrode is changed in accordance with an amount of charges retained in the memory functional units.

The above configuration also exhibits an action and an effect similar to those of the semiconductor memory device according to the first aspect.

Further, since a part of the diffusion region exists at a level higher than the level of the interface between the gate insulating film and the semiconductor layer, while maintaining the resistance of the diffusion region to be low, the thickness of the diffusion region under the memory functional unit can be reduced. Thus, the memory effect can be easily increased.

In the semiconductor memory device according to the second aspect, the part existing at the level higher than the level of the interface between the gate insulating film and the semiconductor layer of the diffusion region can be made of a polycrystalline semiconductor or an amorphous semiconductor.

By using a polycrystalline semiconductor or amorphous semiconductor, a thin diffusion region can be easily formed under the memory functional unit. Therefore, the memory cell of a high memory effect can be easily formed.

In the semiconductor memory device according to the second aspect, the impurity concentration in the diffusion region under the memory functional unit can be set to the range from $1 \times 10^{15}$ cm$^{-3}$ to $1 \times 10^{18}$ cm$^{-3}$.

By setting the range of the impurity concentration as described above, while stably forming the part under the memory functional unit in the diffusion region, the difference between the drain current at the time of writing and the drain current at the time of erasing can be made larger.

In the semiconductor memory device according to the second aspect, the thickness of the diffusion region under the memory functional unit can be set to a range from 1 nm to 50 nm.

By setting the range of the thickness as described above, while preventing resistance of the diffusion region from remarkably increasing and the drain current from decreasing, the difference between the drain current at the time of writing and the drain current at the time of erasing can be made larger.

In the semiconductor memory devices according to the first and second aspects, the memory functional unit has a film having the function of retaining charges, and the surface of the film having the function of retaining charges can be arranged substantially parallel to the surface of the gate insulating film.

By the arrangement, variations in the memory effect of the memory cell can be reduced. Consequently, read current variations of the memory cell can be suppressed. Further, a characteristic change in the memory cell which is retaining information can be reduced, so that the information retention characteristic of the memory cell can be improved.

In addition, the film having the function of retaining charges can be arranged substantially parallel to a side face of the gate electrode.

By arranging the film as described above, the rewriting speed of the memory cell increases, so that the rewriting operation of the memory cell can be increased.

Alternatively, in the semiconductor memory devices according to the first and second aspects, the memory functional unit may have an insulating film separating a film having the function of retaining charges and the channel region or the semiconductor layer from each other, and the insulating film may be thinner than the gate insulating film and have a thickness of 0.8 nm or more.

With the configuration, the voltage in the writing operation and the erasing operation of a memory cell can be decreased or the writing operation and the erasing operation can be performed at higher speed. Since the memory effect of the memory cell increases, the reading speed of the memory part can be increased.

In the semiconductor memory devices according to the first and second aspects, the memory functional unit may have an insulating film separating a film having the function of retaining charges and the channel region or the semiconductor layer from each other, and the insulating film may be thicker than the gate insulating film and have a thickness of 20 nm or less.

With the configuration, the retention characteristic can be improved without deteriorating the short channel effect of the memory cell. Consequently, even when memory cells are formed at high integrating density, a sufficient information retention characteristic can be obtained.

According to embodiments of the present invention, provided is a portable electronic apparatus including the semiconductor memory device according to the first or second aspect. The provided portable electronic apparatus can have improved functions and operating speed and reduced manufacturing cost.

These and other features of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
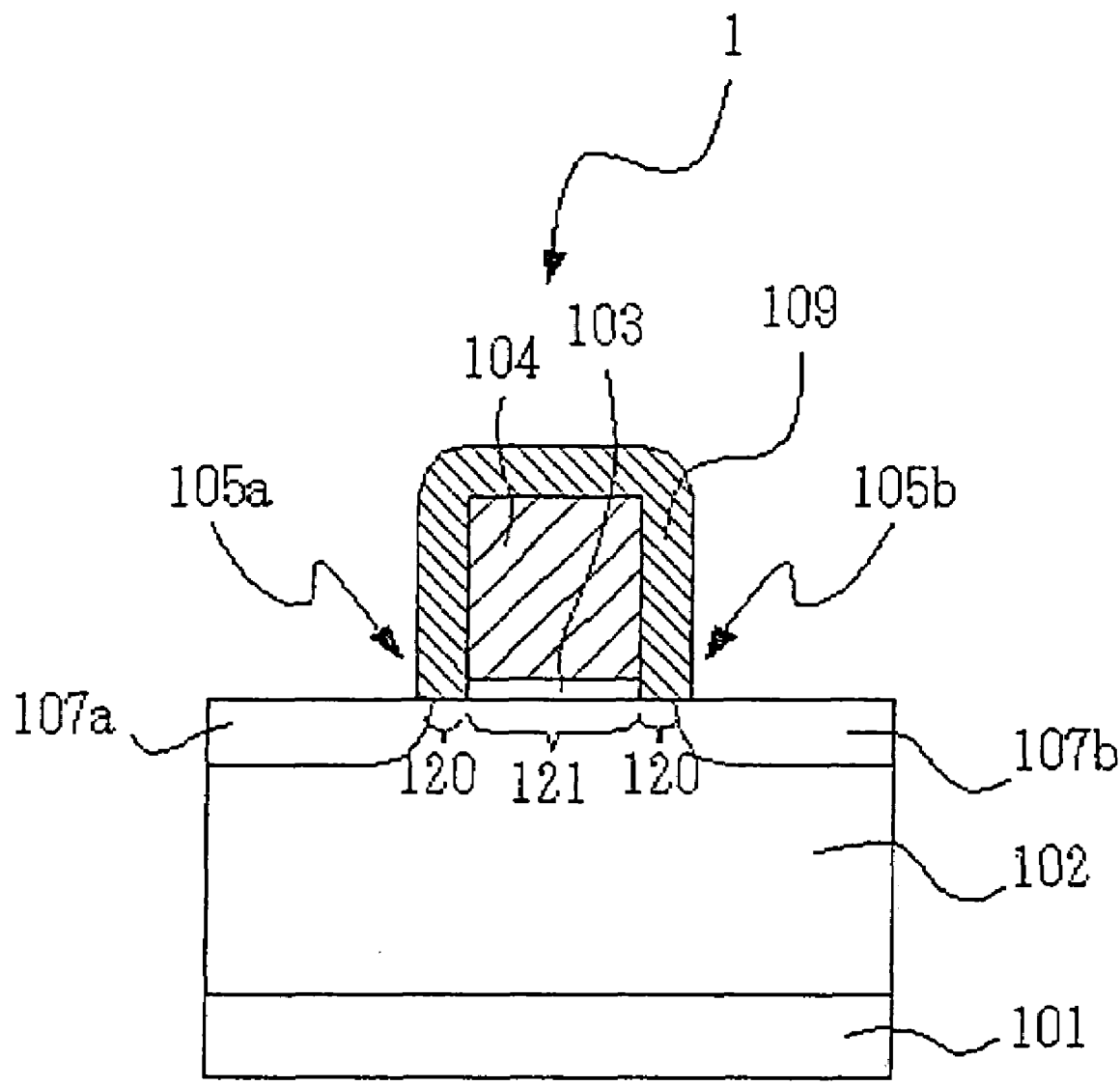
FIG. 1 is a schematic sectional view of a principal portion of a memory cell constituted a semiconductor memory device of an embodiment of the present invention (First Embodiment)

The memory cell constituted the semiconductor memory device of an embodiment of the present invention is mainly constructed by a semiconductor layer, a gate insulating film, a gate electrode, a channel region, a diffusion region and a memory functional unit. Herein, the channel region is normally a region of the same conductive type as that of the semiconductor layer and denotes a region below the gate electrode. The diffusion region denotes a region of the conductive type opposite to that of the channel region.

Concretely, the memory cell of an embodiment of the present invention may be constructed by two regions of a first conductive type as the diffusion region, a region of a second conductive type as the channel region, two memory functional units disposed across a border of the regions of the first and second conductive types, and an electrode provided via the gate insulating film.

In the semiconductor device of an embodiment of the present invention, the semiconductor layer is formed on the semiconductor substrate as the semiconductor layer, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS (Silicon on Sapphire) substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although the more or less of an amount of current flowing therein varies.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. Impurity concentration which is within a known range in this field can be used as impurity concentration in the semiconductor layer and the well region. In the case of using the SOI substrate as the semiconductor layer, the well region may be formed in the surface semiconductor layer and a body region may be provided below the channel region.

The gate insulating film or the insulating film is not particularly limited as long as it is usually used for a semiconductor device, and examples thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode or the electrode is formed in a shape which is usually used for a semiconductor device or a shape having a recess in a lower end portion on the gate insulating film. The gate electrode is preferably formed in an integral form. The gate electrode formed in the integral form means that the gate electrode comprised a single-layered or multi-layer conductive film is not separated and formed in an integral form. The gate electrode may have a side-wall insulating film on its sidewalls. Usually, the gate electrode is not particularly limited as long as it is used for a semiconductor device, and examples of thereof includes a conductive film, for example, a single-layered or multilayer film made of polysilicon, a metal such as copper or aluminum, a high-refractory metal such as tungsten, titanium or tantalum, and a silicide with the high refractory metal. Suitable thickness of the gate electrode is, for example, about 50 to 400 nm. Below the gate electrode, a channel region is formed.

The memory functional unit has at least the function of retaining charges (hereinafter, described as "charge retaining function"). In other words, the memory functional unit has the function of retaining charges, the function of accumulating and retaining charges, the function of trapping charges or the function of holding a charge polarization state. This function exhibits that the memory functional unit contains, for example, a film or a region had the function of retaining charges. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

Reliability of storage and retention can be increased by using the insulating film including a film having the charge retaining function such as a silicon nitride film as the memory functional unit. Since the silicon nitride film is an insulator, even in the case where a charge leak occurs in part of the silicon nitride film, the charges in the whole silicon nitride film are not lost immediately. In the case of arranging a plurality of memory cells, even when the distance between the memory cells is shortened and neighboring memory functional units come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

The film having the charge retaining function does not always have to have a film shape in order to increase the reliability of storage and retention. Preferably, films having the charge retaining function exist discretely in an insulating film. Concretely, it is preferable that the materials having the charge retaining function in the shape of dots be spread in a material which is hard to retain charges, for example, in a silicon oxide.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternately, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of the film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

Preferably, the gate electrode is formed only on the sidewalls of the memory functional unit as described later or does not cover the top part of the memory functional unit. By such arrangement, a contact plug can be disposed closer to the gate electrode, so that reduction in the size of the memory cell is facilitated. It is easy to manufacture the memory cell having such simple arrangement, so that the yield in production can be improved.

In the case of using a conductive film or a semiconductor layer as the charge retaining film, preferably, the conductive film is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

The diffusion regions can function as source and drain regions and have the conductive type opposite to that of the semiconductor layer or well region. In the junction, preferably, difference between impurity concentrations of the diffusion regions and the semiconductor layer or well region is high for the reason that hot electrons or hot holes are generated efficiently with low voltage, and high-speed operation can be performed with lower voltage. The junction depth of the diffusion regions is not particularly limited but can be appropriately adjusted in accordance with the performance or the like of a semiconductor memory device to be obtained. In the case of using an SOI substrate as a semiconductor substrate, the diffusion regions may have a junction depth smaller than the thickness of the surface semiconductor layer. It is preferable that the diffusion region has junction depth almost the same as that of the surface semiconductor layer.

In the semiconductor memory device according to the first aspect, the diffusion region has a high-concentration impurity region disposed so as to be offset from the gate electrode, and a low-concentration impurity region disposed in contact with the high-concentration impurity region so as to overlap with the gate electrode, and an amount of current flowing from one of the diffusion regions to the other diffusion region when a voltage is applied to the gate electrode is changed in accordance with an amount of charges retained in the memory functional units.

In the semiconductor memory device according to the second aspect, a part of the diffusion region exists at a level higher than the level of an interface between the gate insulating film and the semiconductor layer, the diffusion region overlaps with the gate electrode, and an amount of current flowing from one of the diffusion regions to the other diffusion region when a voltage is applied to the gate electrode is changed in accordance with an amount of charges retained in the memory functional units.

First, the diffusion region in the semiconductor memory device according to the first aspect will be described.

The diffusion region is constructed by a high-concentration impurity region and a low-concentration impurity region. Preferably, the impurity concentration of the low-concentration impurity region is set to a range from $1 \times 10^{15}$ $cm^{-3}$ to $1 \times 10^{18}$ $cm^{-3}$. By setting the range of the impurity concentration as described above, while stably forming the part below the memory functional unit of the diffusion region, the difference between the drain current at the time of writing and the drain current at the time of erasing can be made larger. On the other hand, the impurity concentration of the high-concentration impurity region is preferably set to a range from $3 \times 10^{18}$ $cm^{-3}$ to $2 \times 10^{21}$ $cm^{-3}$.

Further, preferably, the thickness of the low-concentration impurity region is set to a range from 1 nm to 50 nm. In the range, while preventing resistance in the diffusion region from remarkably increasing and the drain current from decreasing, the difference between the drain current at the time of writing and the drain current at the time of erasing can be made larger. On the other hand, the thickness of the high-concentration impurity region is preferably set to a range from 10 nm to 200 nm.

Further, the high-concentration impurity region is disposed so as to be offset from the gate electrode, and the low-concentration impurity region overlaps with the gate electrode. Therefore, variations in the reading characteristic of the memory cell can be largely suppressed. The overlap range is, preferably, from 1 nm to 30 nm. By the offset, when a voltage is applied to the gate electrode, easiness of inversion of the offset region under the charge retaining film largely changes according to an amount of charges accumulated in the memory functional units. Thus, the memory effect increases and reduction in the short channel effect is realized. However, when the region is offset too much, drive current between the diffusion regions (source and drain) decreases conspicuously. Consequently, it is preferable that the offset amount, that is, the distance between one of the gate electrode ends in the gate length direction to the closer diffusion region is smaller than the thickness of the charge retaining film in the direction parallel to the gate length direction.

The diffusion region is constructed so that an amount of current flowing from one of the diffusion regions to the other diffusion region when a voltage is applied to the gate electrode is changed in accordance with the amount of charges retained in the memory functional unit. Concretely, in the case where the semiconductor memory device is of an N-channel type, a configuration may be employed such that when electrons accumulated in the memory functional unit increases, the current amount decreases, and when the electrons accumulated in the memory functional unit decreases (or when holes accumulated in the memory functional unit increases), the current amount increases.

The diffusion region in the semiconductor memory device according to the second aspect will now be described.

A part of the diffusion region is positioned at a level higher than the level of the interface between the gate insulating film and the semiconductor layer. In other words, the part of the diffusion region is positioned at a level higher than the surface of the channel region, that is, the under face of the gate insulating film. With the configuration, while maintaining the resistance of the diffusion region to be low, the thickness of the diffusion region below the memory functional unit can be reduced, so that the memory effect can be increased. In this case, it is suitable that, on the part existing higher than the interface between the gate insulating film and the semiconductor layer, that is, on the diffusion region formed in the semiconductor substrate, a conductive film integrated with the diffusion region is laminated. The conductive film is made of, for example, semiconductor such as a polycrystalline silicon or an amorphous silicon, silicide, the above-described metals, high-refractory metals, or the like. In particular, the polycrystalline semiconductor and amorphous semiconductor are preferable for the following reason. Since impurity diffusion speed of polycrystalline semiconductor is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode. The semiconductor memory device according to the first aspect may have this configuration.

Further, the diffusion region overlaps with the gate electrode. By the overlap, stored information can be rewritten by an electric field which crosses the memory functional unit by the voltage difference between the gate electrode existing only on the sidewall part of the memory functional unit and the diffusion region.

The impurity concentration of the diffusion region under the memory functional unit is preferably in the range from $1 \times 10^{15}$ cm$^{-3}$ to $1 \times 10^{18}$ cm$^{-3}$. By setting the range of the impurity concentration as described above, while stably forming the part under the memory functional unit in the diffusion region, the difference between the drain current at the time of writing and the drain current at the time of erasing can be made larger. The impurity concentration in the other regions is not particularly limited.

Further, it is preferable that the thickness of the diffusion region under the memory functional unit is in the range from 1 nm to 50 nm. In the range, while preventing resistance in the diffusion region from remarkably increasing and the drain current from decreasing, the difference between the drain current at the time of writing and the drain current at the time of erasing can be made larger. The thickness of the other regions is not particularly limited.

The diffusion region has a configuration so that the amount of current flowing from one of the diffusion regions to the other diffusion region when a voltage is applied to the gate electrode changes in accordance with the amount of charges retained in the memory functional unit. The configuration is similar to that of the semiconductor memory device according to the first aspect.

The memory cell of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode or the electrode, after that, forming a single-layer film or laminated film including the charge retaining film such as a charge retaining film, charge retaining film/insulating film, insulating film/charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode or the electrode is formed, charge retaining film, charge retaining film/insulating film, insulating film/charge retaining film, insulating film/charge retaining film/insulating film, or the like is formed. An opening is formed in a region which becomes the channel region of these films, a gate electrode material film is formed on the entire surface of the opening, and the gate electrode material film is patterned in a shape including the opening and larger than the opening, thereby forming the gate electrode and the memory functional unit. As described above, the memory cell of the present invention can be formed by a process which is much simpler as compared with that of an EEPROM having a floating gate and the like. Since the process of forming the memory cell of the present invention is highly compatible with a process of forming a normal MOSFET, it is easy to simultaneously form the memory cell and an MOSFET.

An example of a method of forming a memory cell of an embodiment of the present invention will be described. First, by a known procedure, a gate insulating film and a gate electrode are formed on a semiconductor substrate. Subsequently, on the entire top face of the semiconductor substrate, a silicon oxide film having a thickness of 0.8 to 20 nm, more preferably, 3 to 10 nm is formed by thermal oxidation or deposited by CVD (Chemical Vapor Deposition). After that, a silicon nitride, film having a thickness of 2 to 15 nm, more preferably, 3 to 10 nm is deposited by CVD on the entire top face of the silicon oxide film. Further, a silicon oxide film having a thickness of 20 to 70 nm is deposited by CVD on the entire top face of the silicon nitride film.

Subsequently, the silicon oxide film/silicon nitride film/silicon oxide film are etched back by anisotropic etching, thereby forming a memory functional unit which is optimum for storing information in a memory cell sidewall spacer shape on a sidewall of the gate electrode.

After that, by implanting ions with the gate electrode and the memory functional unit in the memory cell sidewall spacer shape as a mask, diffusion regions (source and drain regions) are formed. After that, by performing a silicide process and an upper wiring process by a known procedure, a memory cell can be formed.

In the case of constructing the memory cell array by arranging memory cells of embodiments of the present invention, the best mode of the memory cell satisfies all of the requirements: for example, (1) the gate electrodes of a plurality of memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface substantially parallel to the surface of the gate insulating film; (5) a silicon nitride film in the memory functional unit is isolated from a word line and a channel region via a silicon oxide film; (6) the region having the function of retaining charge (example, region having the silicon nitride film) and a diffusion region in the memory functional unit are overlapped; (7) the thickness of the insulating film separating the silicon nitride film having the surface which is substantially parallel to the surface of the gate insulating film from the channel region or semiconductor layer and the thickness of the gate insulating film are different from each other; (8) an operation of writing/erasing one memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. Beneficial results may be obtained even when fewer than all ten requirements are satisfied. It may be sufficient for the memory cell to satisfy even one of the requirements.

In the case where the memory cell satisfies at least the requirements (3) and (9), it is very useful, for the following reasons.

First, the bit line contact can be disposed closer to the memory functional unit on the word line sidewall or even when the distance between memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo and etching process for isolating the memory functional unit becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo and etching process for isolating the memory functional unit for each memory cell is necessary, and a margin for positioning in the photolithography process and a margin for film reduction by etching are necessary.

Moreover, since the electrode having the function of assisting the writing and erasing operations does not exist on the memory functional unit and the device structure is simple, the number of processes decreases, so that the yield in production can be increased. Therefore, it facilitates formation with a transistor as a component of a logic circuit or an analog circuit, and a cheap semiconductor memory device can be obtained.

The embodiment of the present invention wherein not only the requirements (3) and (9) are satisfied but also the requirement (6) is satisfied provides additional benefits.

Specifically, writing and erasing can be performed with a very low voltage by overlapping the charge retaining region in the memory functional unit and the diffusion region. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed at high speed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed at high speed.

In short, in the case where the requirement (3) or (9) is not satisfied, even when the requirement (6) is not satisfied, writing operation can be performed at high speed. Not satisfying the requirement (3) or (9), however, causes increase in the occupation area of a memory cell. As clear from the above, it is preferable to satisfy the requirements (3), (6) and (9) at the same time.

In the semiconductor memory device of an embodiment of the present invention, the memory cell may be mounted on the same chip with a logic transistor. In such a case, the semiconductor device of the present invention, particularly, the memory cell can be formed by a process having high compatibility with a process of forming a normal standard transistor such as a transistor or a logic transistor, they can be formed simultaneously. Therefore, a process of forming both the memory cell and a transistor or a logic transistor is very simple and, as a result, a cheap embedded device can be obtained.

In the semiconductor memory device of the present invention, the memory cell can store information of two or more values in one memory functional unit. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional unit.

The semiconductor memory device of an embodiment of the present invention can be widely applied by being combined with an other memory cell, a logic device, a logic circuit or the like to: a data processing system such as a personal computer, a note-sized computer, a laptop computer, a personal assistant/transmitter, a mini computer, a workstation, a main frame, a multiprocessor/computer, a computer system of any other type, or the like; an electronic part as a component of the data processing system, such as a CPU, a memory: or a data memory, device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card.

Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device of an embodiment of the present invention may be provided as at least a part of a control circuit or a data storing circuit of an electronic device or, as necessary, detachably assembled.

In particular, it is preferable to use the semiconductor memory device of an embodiment of the present invention for a portable electronic apparatus driven by a battery, more particularly, a portable information terminal.

Embodiments of a semiconductor memory device and a portable electronic apparatus of an embodiment of the present invention will be described in detail below with reference to the drawings.

Although the following first to ninth embodiments relate to an example in which a gate electrode and a diffusion region in the semiconductor memory device do not overlap with each other, as long as necessity of an offset region is not stated, the gate electrode and the diffusion region may overlap with each other.

Tenth and eleventh embodiments relate to a semiconductor memory device in which the gate electrode and the diffusion region overlap with each other. Effects obtained by the overlap will be described later.

FIRST EMBODIMENT

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

The memory functional units 105a and 105b for substantially retaining charges are the parts on both sidewalls of the gate electrode 104. It is therefore sufficient that the silicon nitride film 109 is formed only in regions corresponding to the parts. Each of the memory functional units 105a and 105b may have a structure in which fine particles each made of a conductor or semiconductor and having a nanometer size are distributed like discrete points in an insulating film. When the fine particle has a size less than 1 nm, a quantum effect is too large, so that it becomes hard for charges to go(tunnel) to the dots. When the size exceeds 10 nm, a conspicuous quantum effect does not appear at room temperature. Therefore, the diameter of the fine particle is preferably in a range from 1 nm to 10 nm. The silicon nitride film serving as a charge retaining film may be formed in a sidewall spacer shape on a side face of the gate electrode.

Figure 2:
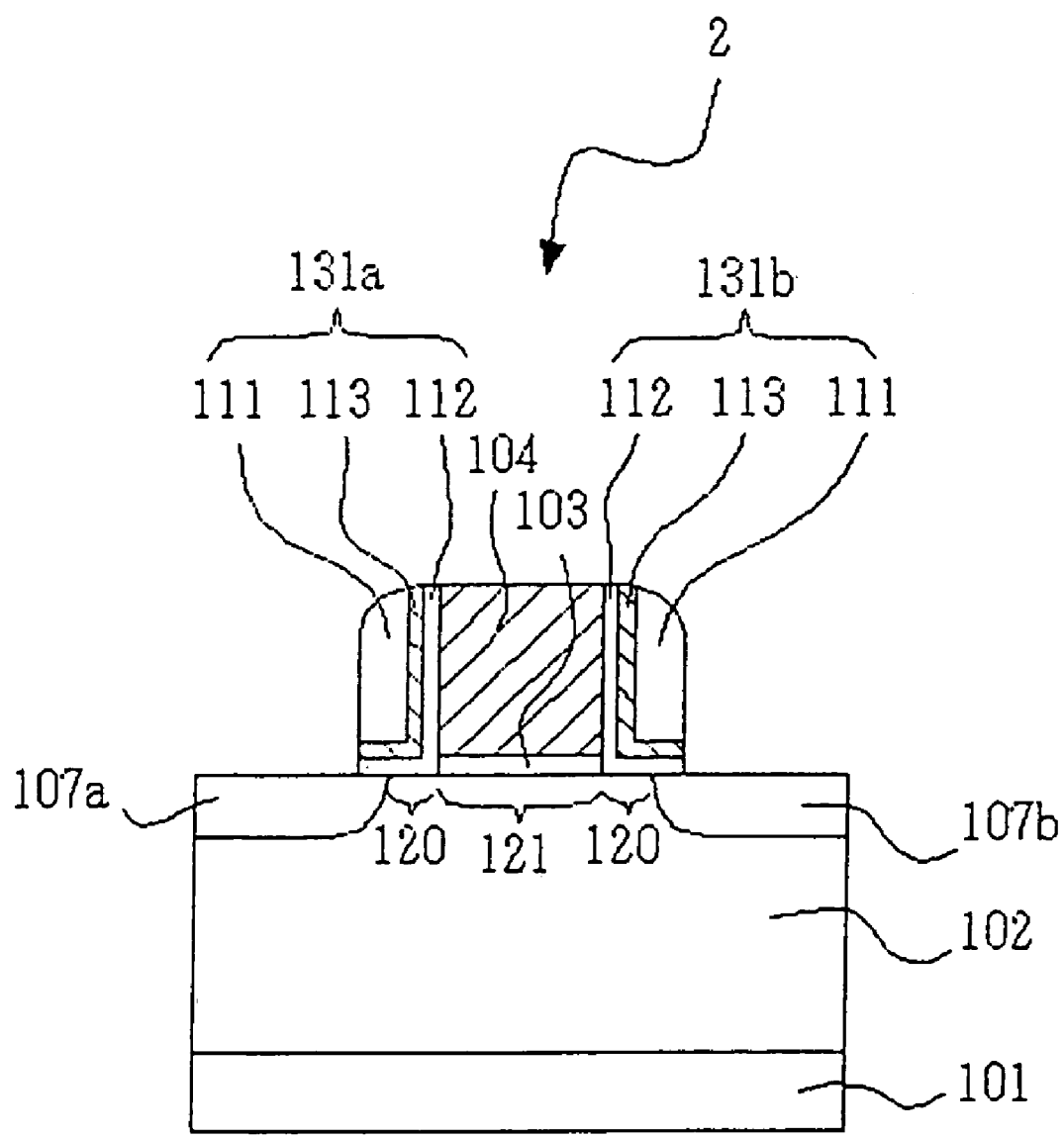
FIG. 2 is a schematic sectional view of principal portions of another memory cells constituted semiconductor memory devices of an embodiment of the present invention (First Embodiment)

The principle of the writing operation of the memory cell will be described with reference to FIGS. 3 and 4. The case where whole memory functional units 131a and 131b have the function of retaining charges will be described. "Writing" denotes herein injection of electrons into the memory functional units 131a and 131b when the memory cell is of the N channel type. Hereinafter, on assumption that the memory cell is of the N channel type, description will be given. Further, each of the memory functional units 131a and 131b may be a laminated body of a silicon oxide film 112, a silicon nitride film 113 and a silicon oxide film 111 from the side of a sidewall of the gate electrode 104 as shown in FIG. 2.

Figure 3:
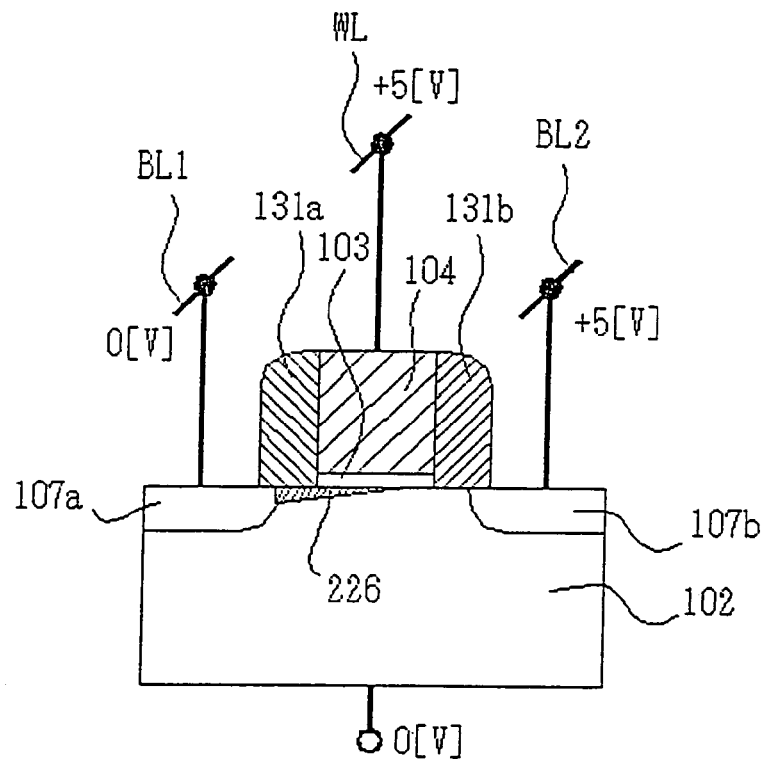
FIGS. 3 and 4 are views for illustrating writing operations of memory cells constituted semiconductor memory devices of an embodiment of the present invention (First Embodiment)

As shown in FIG. 3, the first diffusion region 107a of the N type is set as a source electrode, and the second diffusion region 107b of the N type is set as a drain electrode, in order to inject electrons (write) the second memory functional unit 131b. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). Writing is performed by injection of the hot electrons into the second memory functional unit 131b. Since hot electrons are not generated in the vicinity of the first memory functional unit 131a, writing is not performed.

Figure 4:
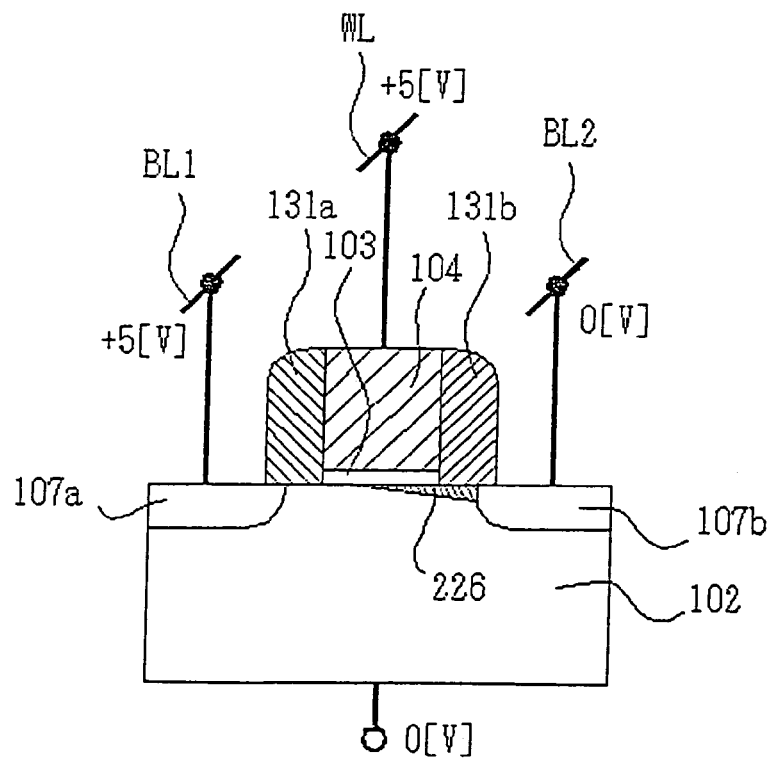

On the other hand, as shown in FIG. 4, the second diffusion region 107a is set as the source electrode, and the first diffusion region 107a is set as the drain electrode, in order to inject electrons (write) into the first memory functional unit 131a. For example, 0 V is applied to the second diffusion region 107b and the P-type well region 102, +5 V is applied to the first diffusion region 107a, and +5 V is applied to the gate electrode 104. Electrons are injected into the first memory functional unit 131a and writing can be performed by interchanging the source and drain regions so as to be different from the case of injecting electrons into the second memory functional unit 131b.

The principle of erasing operation of the memory cell will now be described with reference to FIGS. 5 and 6.

Figure 5:
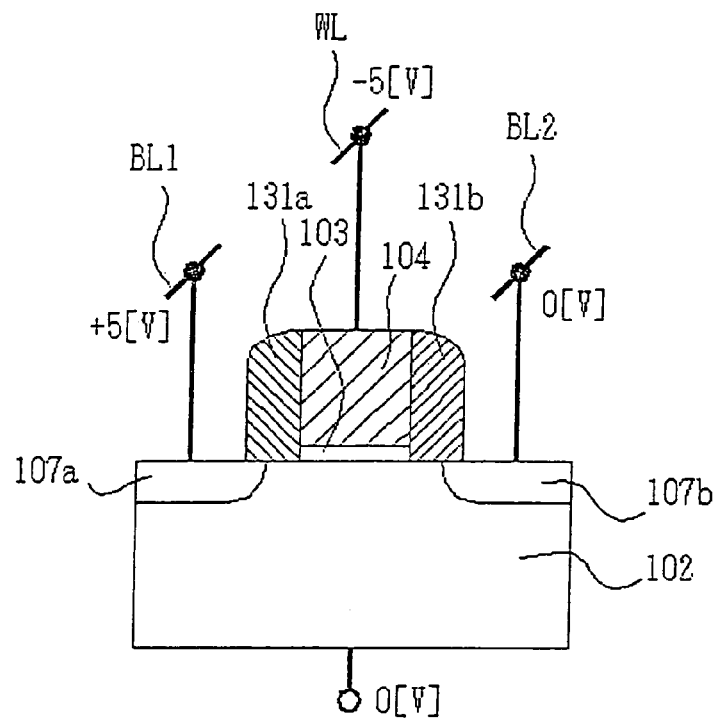
FIGS. 5 and 6 are views for illustrating erasing operations of memory cells constituted semiconductor memory devices of an embodiment of the present invention (First Embodiment)

In a first method of erasing information stored in the first memory functional unit 131a, the PN junction between the first diffusion region 107a and the P-type well region 102 is reverse-biased and, further, negative voltage (for example, −5 V) is applied to the gate electrode 104, by applying positive voltage (for example, +5 V) to the first diffusion region 107a and applying 0 V to the P-type well region 102 as shown in FIG. 5. At this time, in the vicinity of the gate electrode 104 in the PN junction, due to the influence of the gate electrode to which the negative voltage is applied, particularly, gradient of potential becomes sharp. Consequently, hot holes (holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
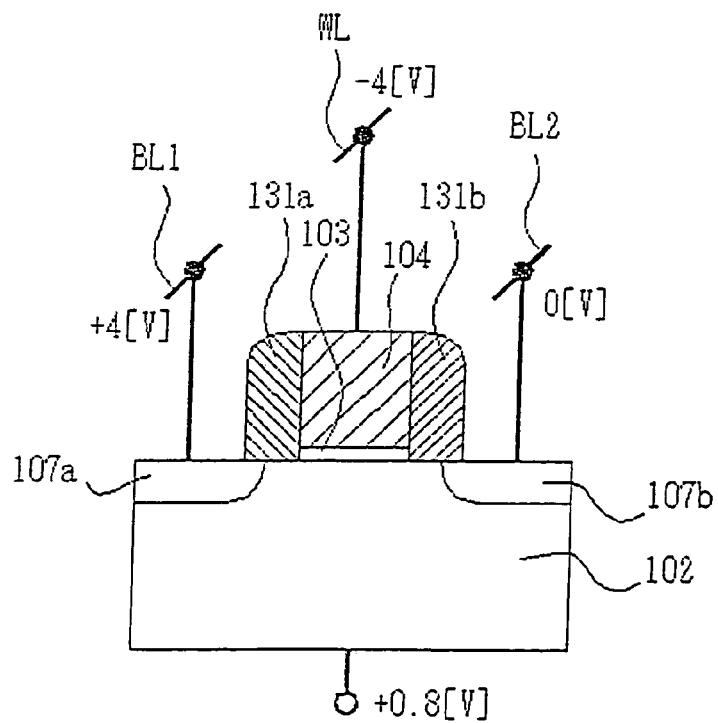

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, electrons injected in the P-type well region 102 become a trigger, and hot holes are generated in the PN junction positioned on the opposite side by applying forward voltage between the P-type well region 102 and the second diffusion region 107b. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the memory cell due to hot carriers can be suppressed.

In any of the erasing methods, over-erasure does not occur easily in the memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

Further, the principle of reading operation of the memory cell will be described with reference to FIG. 7.

Figure 7:
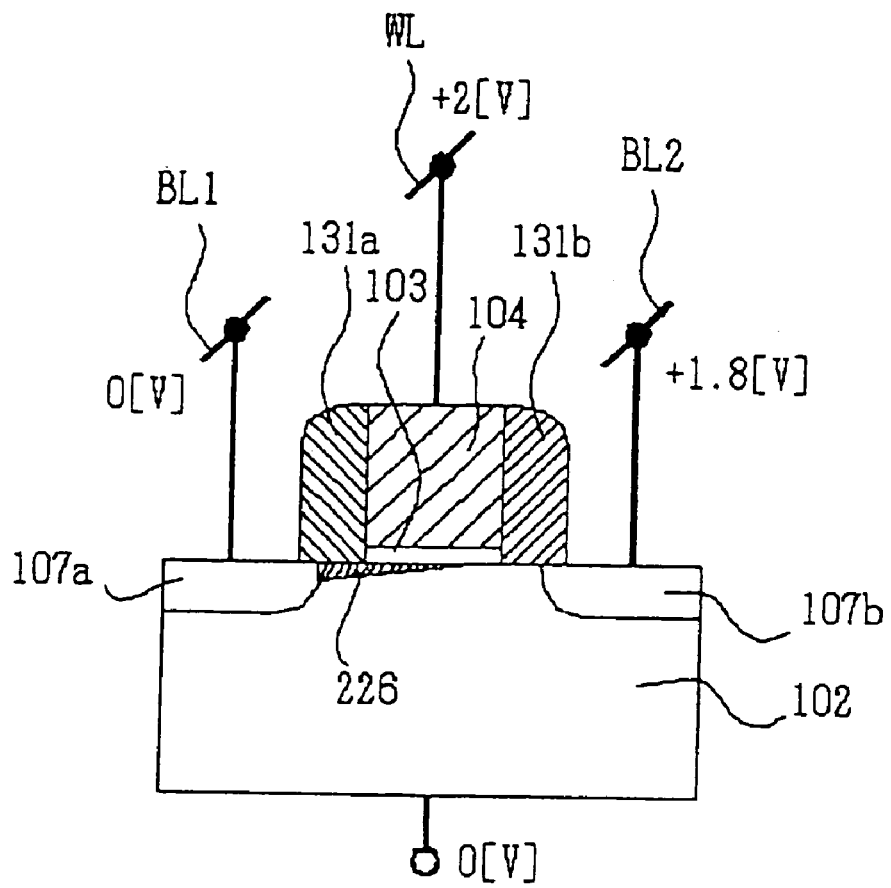
FIG. 7 is a view for illustrating a reading operation of a memory cell constituted a semiconductor memory device of an embodiment of the present invention (First Embodiment)

In the case of reading information stored in the first memory functional unit 131a as shown in FIG. 7, the first diffusion region 107a is set as a source electrode, the second diffusion region 107b is set as a drain electrode, and the transistor is allowed to operate in a saturated region. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. The presence/absence of charge accumulation in the second memory functional unit 131b does not exert an influence on the drain current since the pinch-off point occurs in the area in the vicinity of the drain.

In the case of reading information stored in the second memory functional unit 131b, the second diffusion region 107b is set as a source electrode, the first diffusion region 107a is set as a drain electrode, and the transistor is operated in a saturated region. It is sufficient to apply, for example, 0V to the second diffusion region 107b and the P-type well region 102, +1.8 V to the first diffusion region 107a and +2 V to the gate electrode 104. Information stored in the second memory functional unit 131b can be read by interchanging the source and drain regions of the case of reading information stored in the first memory functional unit 131a.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. A memory cell array can be constructed by connecting a word line WL to the gate electrode 104 of the memory cell, connecting a first bit line BL1 to the first diffusion region 107a, connecting a second bit line BL2 to the second diffusion region 107b, and arranging memory cells.

In the above-described operating method, writing and erasing of two bits per one transistor are performed by interchanging the source electrode and the drain electrode. Alternately, the transistor may operate as a 1-bit memory by fixing the source electrode and the drain electrode. In this case, common fixed voltage can be applied to one of the source and drain regions, so that the number of bit lines connected to the source/drain regions can be reduced to the half.

As obvious from the above description, in the memory cell in the semiconductor memory device of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

SECOND EMBODIMENT

Figure 8:
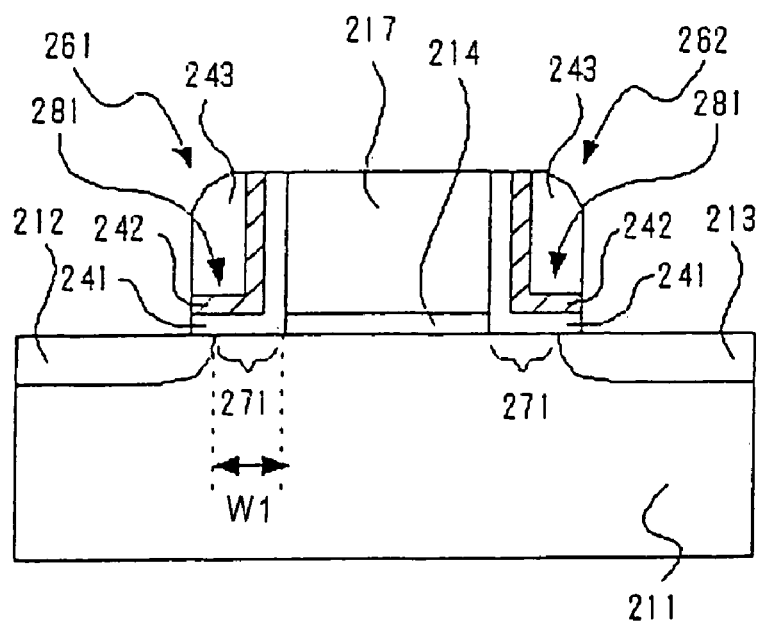
FIG. 8 is a schematic sectional view of a principal portion of a memory cell constituted a semiconductor memory device of an embodiment of the present invention (Second Embodiment)

A memory cell in a semiconductor memory device according to a second embodiment has a configuration substantially similar to that of the memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. The volume of the charge retaining film can be appropriately reduced, movement of charges in the charge retaining film can be regulated, and occurrence of a characteristic change due to charge movement during retention of information can be suppressed, as compared with the case where the memory functional unit is constructed only by the charge retaining film. Further, charge injecting efficiency at the time of rewriting operation becomes high by employing the structure in which the silicon nitride film 242 is sandwiched by the silicon oxide films 241 and 243, so that higher-speed operation can be performed. In the memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
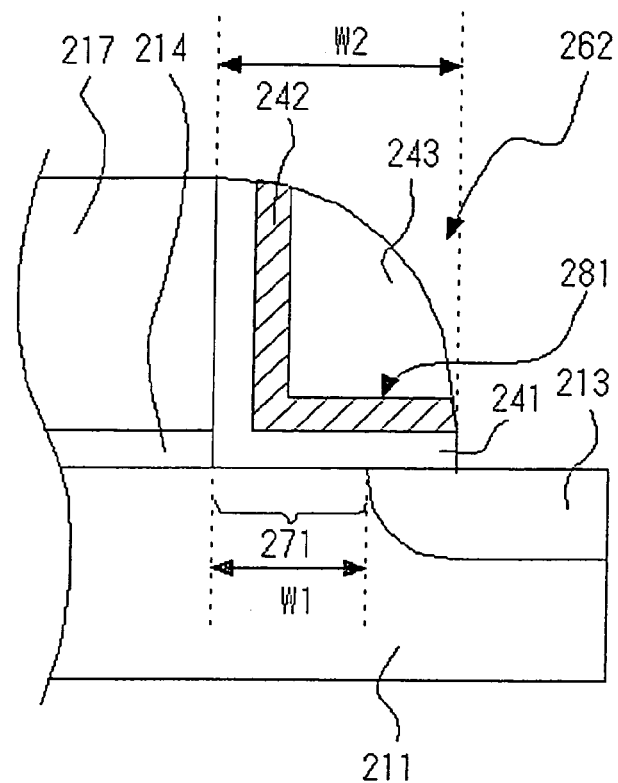
FIG. 9 is a schematic enlarged sectional view of a principal portion of a memory cell in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2 the overlap amount between the memory functional unit 262 and the diffusion region 213 is expressed as W2−W1. It is important herein that the memory functional unit 262 constructed by the silicon oxide film 242 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
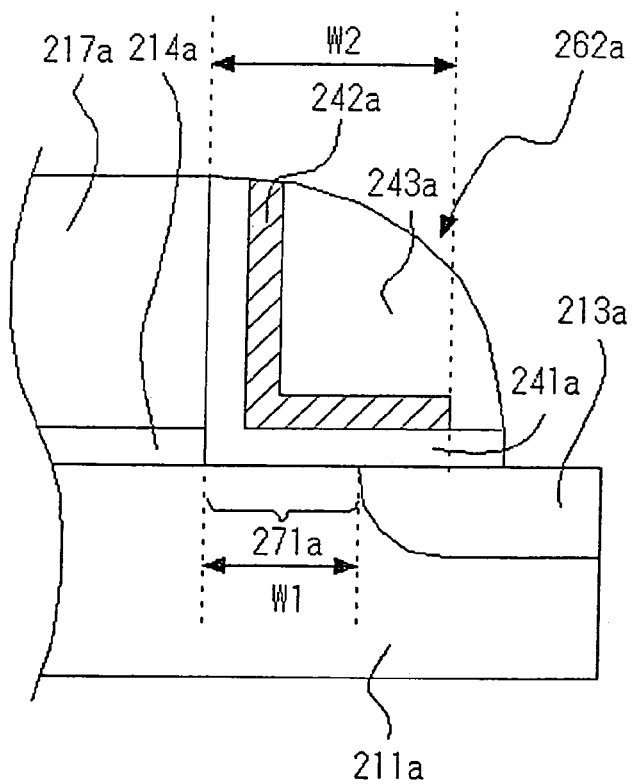
FIG. 10 is a schematic enlarged sectional view of a principal portion of a memory cell constituted a semiconductor memory device of an embodiment of the present invention.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
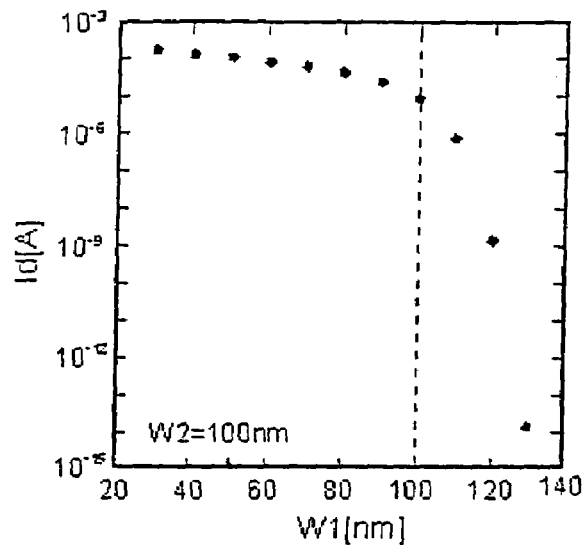
FIG. 11 is a diagram showing an electric characteristic of a memory cell constituted a semiconductor memory device of an embodiment of the present invention (Second Embodiment)

FIG. 11 shows drain current Id when the width W2 of the memory functional unit 262 is fixed to 100 nm and the offset amount W1 is changed in the structure of the memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, memory cell arrays were produced by fixing W2 to 100 nm and setting W1 to 60 nm and 100 nm as design values. In the case where W1 is 60 nm, the silicon nitride film 242 and the diffusion regions 212 and 213 overlap with each other by 40 nm as a design value. In the case where W1 is 100 nm, there is no overlap as a design value. Reading time of the memory cell arrays was measured and worst cases considering variations were compared with each other. In the case where W1 is set to 60 nm as a design value, read access time is 100 times as fast as that of the other case. In practice, the read access time is preferably 100 nsec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. The volume of the charge retaining film can be appropriately reduced, movement of charges in the charge retaining film can be regulated, and occurrence of a characteristic change due to charge movement during retention of information can be suppressed, as compared with the case where the memory functional unit is constructed only by the charge retaining film.

Figure 12:
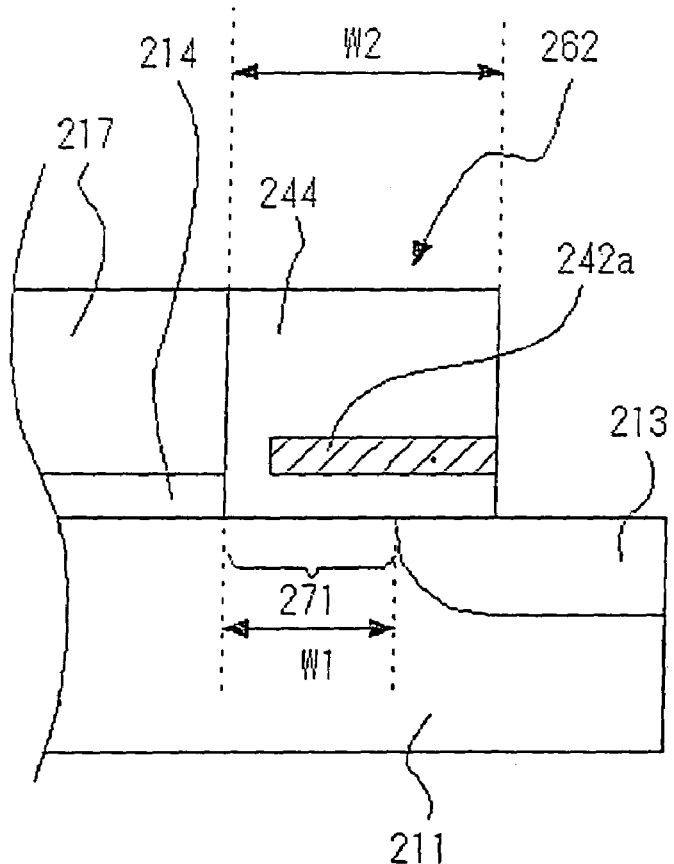
FIG. 12 is a schematic sectional view of a principal portion of an another memory cell constituted a semiconductor memory device of an embodiment of the present invention (Second Embodiment)

The memory functional unit preferably includes the charge retaining film disposed substantially parallel to the gate insulating film surface. In other words, it is preferable that the level of the top face of the charge retaining film in the memory functional unit is positioned parallel to the level of the top face of the gate insulating film. Concretely, as shown in FIG. 12, the silicon nitride film 242a as a charge retaining film of the memory functional unit 262 has a surface substantially parallel with the surface of the gate insulating film 214. In other words, it is preferable that the silicon nitride film 242a is formed at a level parallel to the level corresponding to the surface of the gate insulating film 214.

Formation easiness of the inversion layer in the offset region 271 can be effectively controlled in accordance with the more or less of an amount of charges accumulated in the silicon nitride film 242a by the existence of the silicon nitride film 242a substantially parallel to the surface of the gate insulating film 214 in the memory functional unit 262. Thus, the memory effect can be increased. Even in the case where the offset amount (W1) varies, a change in the memory effect can be maintained relatively small, and variations of the memory effect can be suppressed, by forming the silicon nitride film 242a substantially parallel to the surface of the gate insulating film 214. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is substantially parallel to the surface of the gate insulating film 214 from the channel region (or well region) By the insulating film, dissipation of the charges accumulated in the charge retaining film is suppressed and a memory cell having a better retention characteristic can be obtained.

The distance from the surface of the semiconductor substrate to charges accumulated in the charge retaining film can be maintained substantially constant by controlling the thickness of the silicon nitride film 242a and controlling the thickness of the insulating film below the silicon nitride film 242a (portion on the offset region 271 in the silicon oxide film 244) to be constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be substantially controlled, and variations in the memory effect of the memory cell can be reduced very much.

THIRD EMBODIMENT

Figure 13:
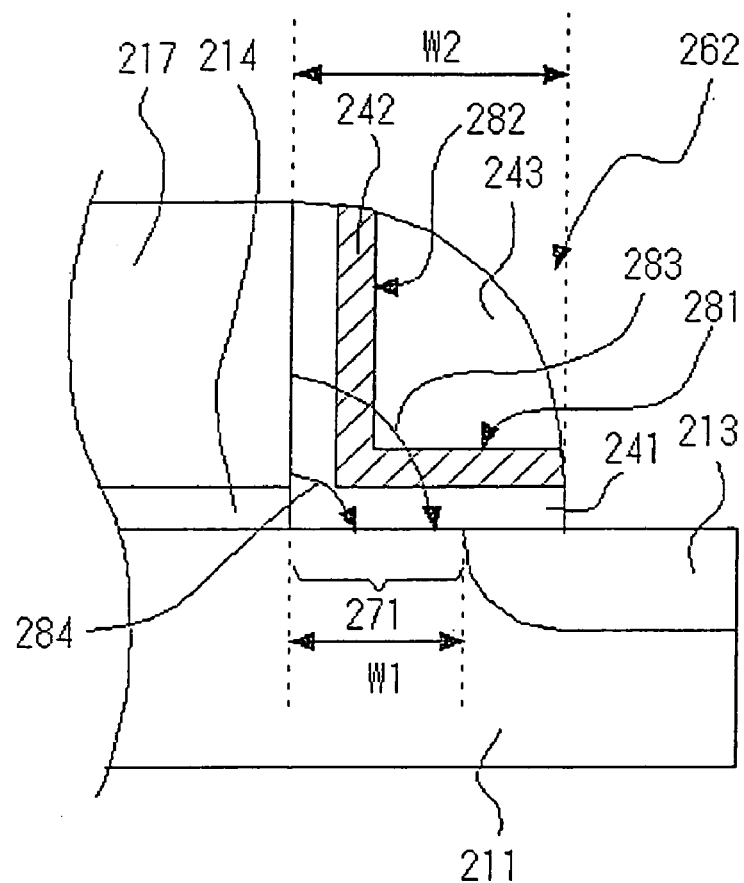
FIG. 13 is a schematic sectional view of a principal portion of a memory cell constituted a semiconductor memory device of an embodiment of the present invention (Third Embodiment)

The memory functional unit 262 in a semiconductor memory device of a third embodiment has a shape in which the silicon nitride film 242 as a charge retaining film has substantially uniform thickness and is disposed almost in parallel with the surface of the gate insulating film 214 as shown in FIG. 13 (region 281) and, further, substantially parallel to a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, charges injected into the memory functional unit 262 increase in the rewriting operation, and the rewriting speed increases, by including the charge retaining film shown by the arrow 282.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film substantially parallel to the surface of the gate insulating film from the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode from the charge retaining film extended substantially parallel with the side face of the gate electrode. The insulating film prevents injection of charges from the gate electrode into the charge retaining film and accordingly prevents a change in the electric characteristics. Thus, the reliability of the memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be substantially controlled, and charge leak can be prevented.

FOURTH EMBODIMENT

In a fourth embodiment, optimization of the gate electrode, the memory functional unit, and the distance between the source and drain regions of a memory cell in a semiconductor memory device will be described.

Figure 14:
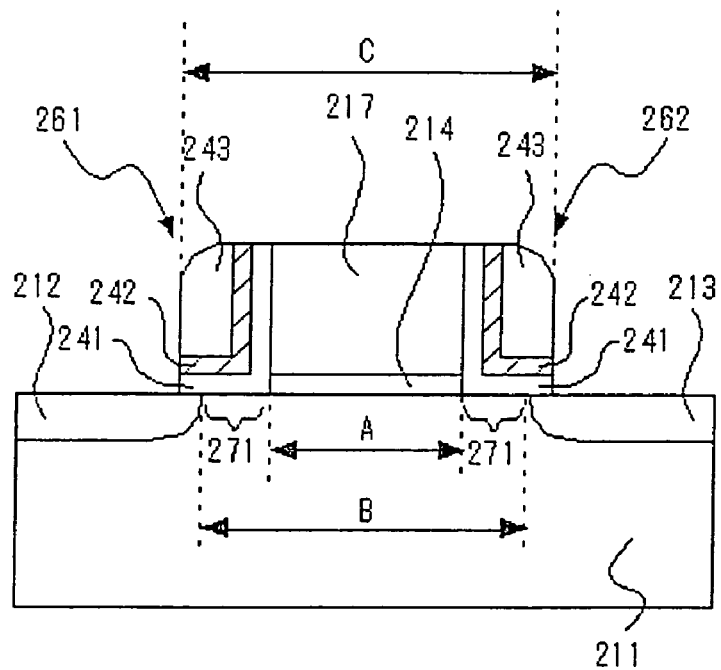
FIG. 14 is a schematic sectional view of a principal portion of a memory cell constituted a semiconductor memory device of an embodiment of the present invention (Forth Embodiment)

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

FIFTH EMBODIMENT

Figure 15:
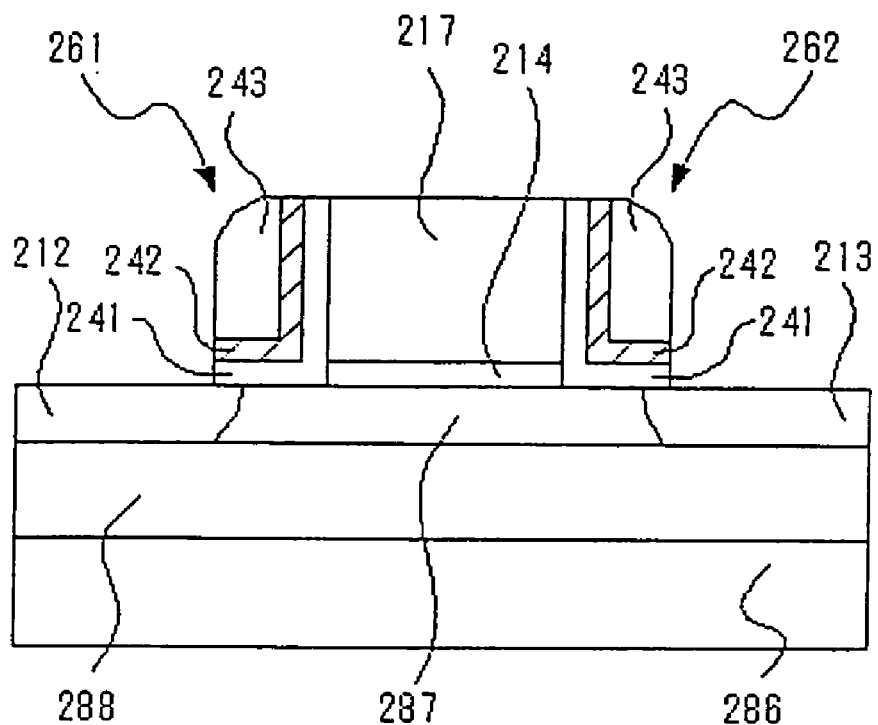
FIG. 15 is a schematic sectional view of a principal portion of a memory cell constituted a semiconductor memory device of an embodiment of the present invention (Fifth Embodiment)

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the memory cell as well, action and effect similar to those of the memory cell of the second embodiment are obtained. Further, junction capacitance between the diffusion regions 212 and 213 and the body region 287 can be remarkably reduced, so that higher-speed operation and lower power consumption of the device can be achieved.

SIXTH EMBODIMENT

Figure 16:
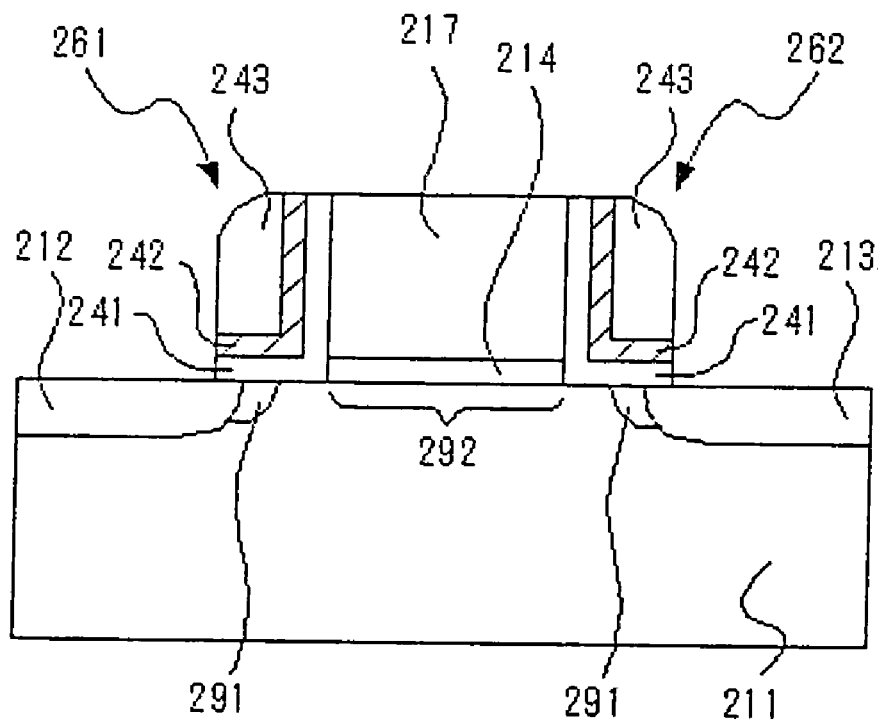
FIG. 16 is a schematic sectional view of a principal portion of a memory cell constituted a semiconductor memory device of an embodiment of the present invention (Sixth Embodiment)

A memory cell in a semiconductor memory device in a sixth embodiment has, as shown in FIG. 16, a configuration substantially similar to that of the memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5\times10^{17}$ to $1\times10^{19}$ cm$^{-3}$. The P-type impurity concentration of the region 292 can be set to, for example, $5\times10^{16}$ to $1\times10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the memory cell with low rewriting voltage or high rewriting speed and high reading speed can be obtained.

In FIG. 16, the threshold of the whole transistor remarkably increases, by providing the P-type high-concentration region 291 in the vicinity of the source/drain regions and below the memory functional unit (that is, not immediately below the gate electrode). The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, only the threshold in the writing operation largely fluctuates, and the memory effect (the difference between the threshold in the writing operation and that in the erasing operation) can be remarkably increased, by disposing the P-type high-concentration region 291 under the memory functional unit and in the vicinity of the source/drain regions.

SEVENTH EMBODIMENT

Figure 17:
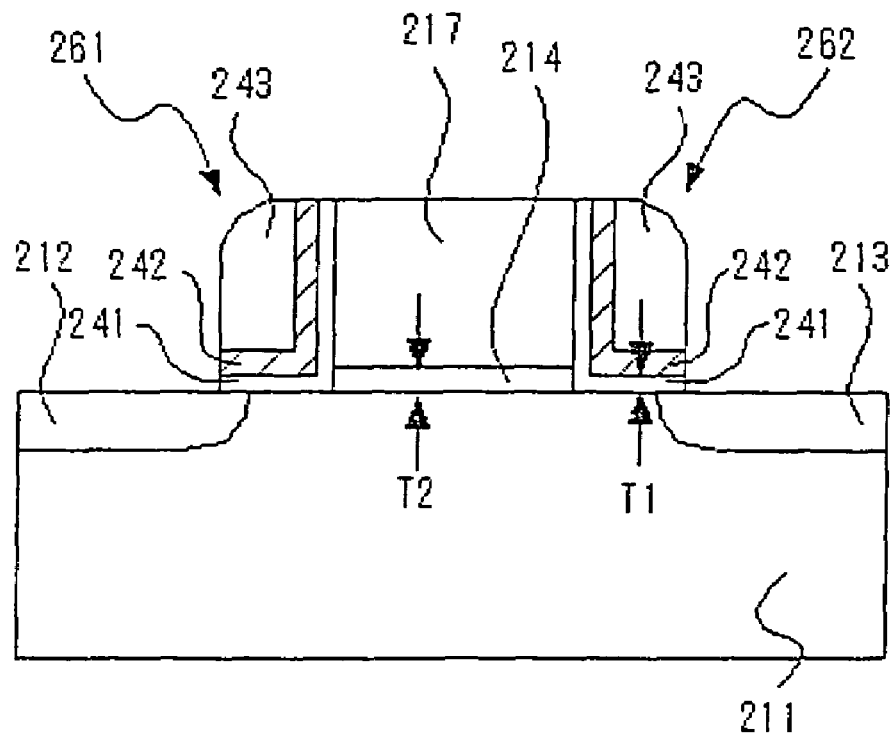
FIG. 17 is a schematic sectional view of a principal portion of a memory cell constituted a semiconductor memory device of an embodiment of the present invention (Seventh Embodiment)

A memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) from the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the memory cell for the following reason.

In the memory cell, the insulating film for separating the charge retaining film from the channel region or well region is not sandwiched by the gate electrode and the channel region or well region. Consequently, to the insulating film for separating the charge retaining film from the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) from the channel region or well region, so that a high electric field from the gate electrode directly acts. Therefore, in an EEPROM, the thickness of the insulating film separating the floating gate from the channel region or well region is regulated, and optimization of the function of the memory cell is inhibited. As clear from the above, an essential reason for increasing the flexibility of T1 is that the insulating film separating the charge retaining film and the channel region or well region is not sandwiched between the gate electrode and the channel region or well region.

As will be apparent from the above, by setting T1<T2, without deteriorating the withstand voltage performance of the memory, the voltage of the writing and erasing operations is decreased, or the writing operation and erasing operation are performed at high speed and, further, the memory effect can be increased.

More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a large design rule, to drive the liquid crystal panel TFT, voltage of 15 to 18 V at the maximum is required normally, so that the gate oxide film cannot be thinned normally. In the case of mounting a nonvolatile memory for image adjustment on the liquid crystal driver LSI, in the memory cell of the present invention, the thickness of the insulating film separating the charge retaining film (silicon nitride film 242) from the channel region or well region can be designed optimally independently of the thickness of the gate insulating film. For example, the thickness can be individually set as T1=20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

EIGHTH EMBODIMENT

Figure 18:
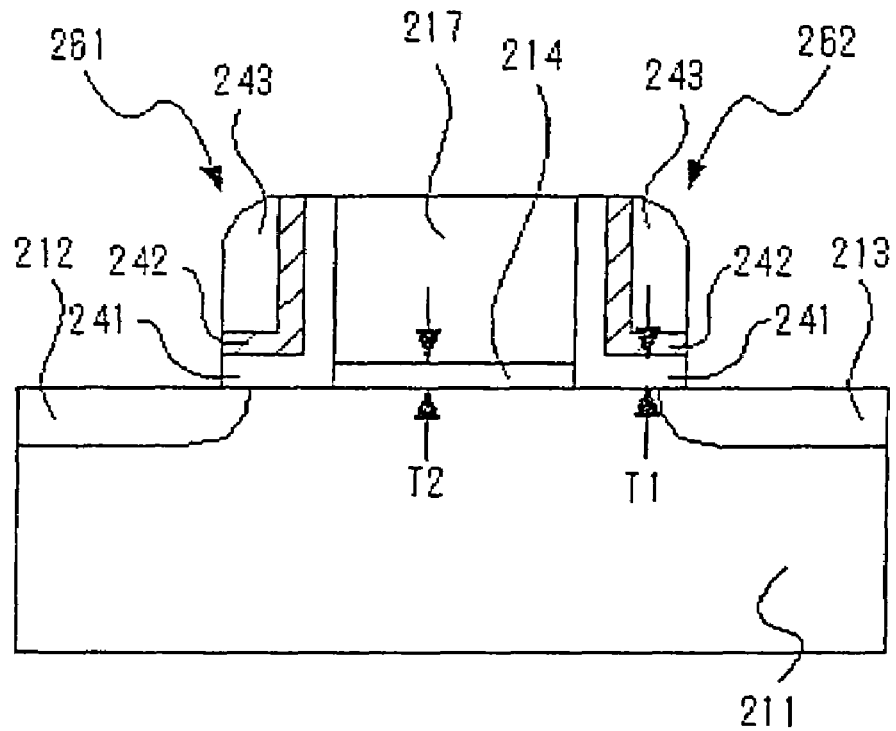
FIG. 18 is a schematic sectional view of a principal portion of a memory cell constituted a semiconductor memory device of an embodiment of the present invention (Eighth Embodiment)

A memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) from the channel region or well region is larger than the thickness (T2) of the gate insulating film.

The thickness T2 of the gate insulating film 214 has an upper limit value due to demand of preventing a short channel effect of the cell. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) from the channel region or well region can be designed optimally independent of the gate insulating film thickness. Thus, an effect that the memory functional unit does not disturb scaling is obtained.

The reason why flexibility of designing T1 is high in the memory cell is that, as described already, the insulating film separating the charge retaining film from the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate from the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film from the channel region or well region, but only a relatively low electric field which spreads in the horizontal direction from the gate electrode acts. Consequently, the memory cell having a gate length which is reduced to be equal to or less than the gate length of a logic transistor of the same process generation can be realized.

NINTH EMBODIMENT

A ninth embodiment relates to a change in the electric characteristic at the time of rewriting a memory cell of a semiconductor memory device.

Figure 19:
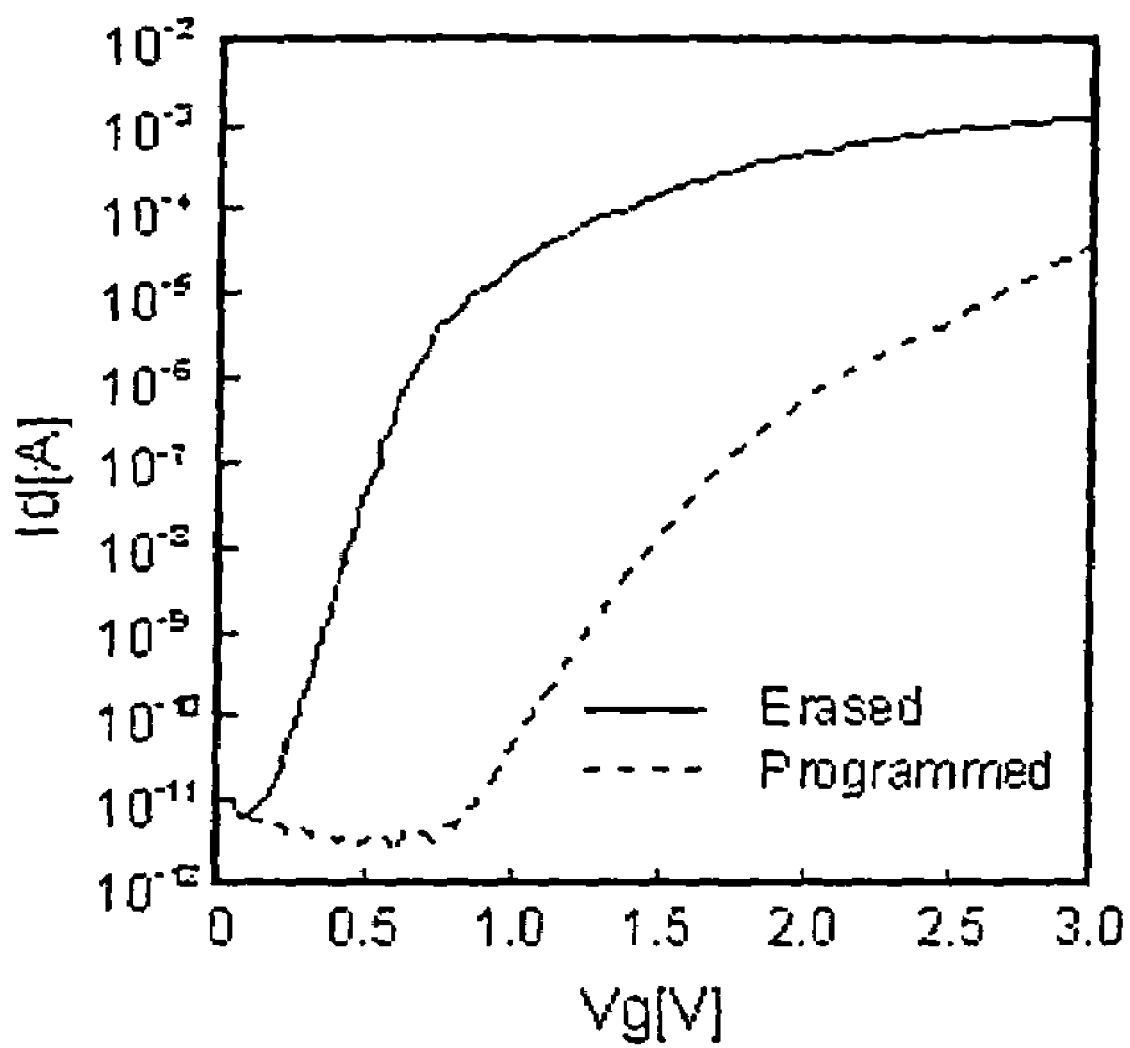
FIG. 19 is a diagram showing an electric characteristic of a memory cell constituted a semiconductor memory device of an embodiment of the present invention (Ninth Embodiment)

In an N-channel type memory cell, when an amount of charges in a memory functional unit changes, a drain current (Id)-gate voltage (Vg) characteristic (actual measurement value) as shown in FIG. 19 is exhibited.

Figure 27:
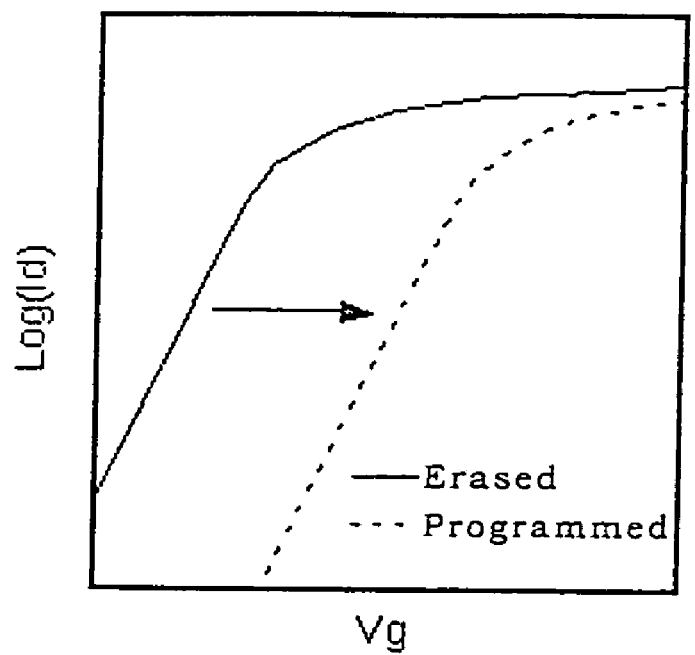
FIG. 27 is a diagram showing an electric characteristic of a flash memory of the prior art.

As obvious from FIG. 19, in the case of performing a writing operation from an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 27).

Appearance of such a characteristic is a peculiar phenomenon which occurs since the gate electrode and the diffusion region are offset from each other, and the gate electric field does not easily reach the offset region. When the memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As should be understood from the above, in the memory cell in the semiconductor memory device of an embodiment of the present invention, the drain current ratio between the writing operation and the erasing operation can be particularly made high.

TENTH EMBODIMENT

Figure 20:
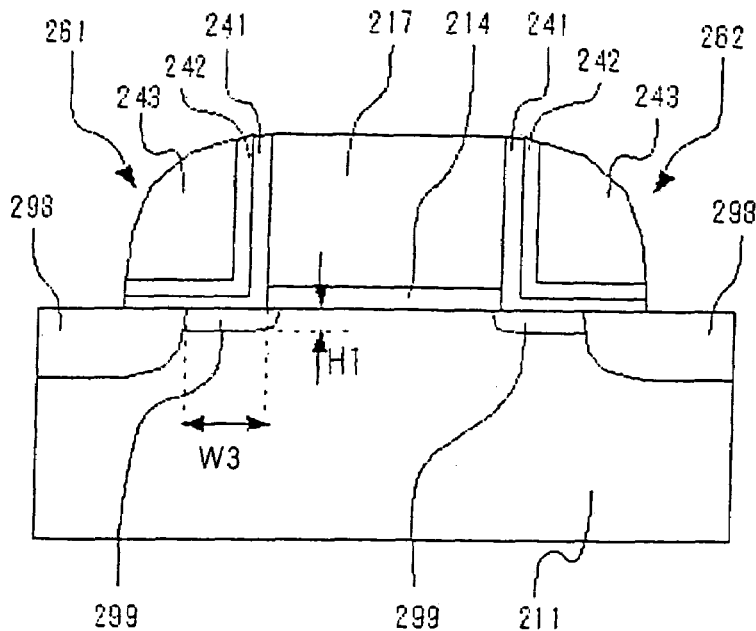
FIG. 20 is a schematic sectional view of a principal portion of a memory cell constituted a semiconductor memory device of an embodiment of the present invention (Tenth Embodiment)

A memory cell in a semiconductor memory device of a tenth embodiment is formed in such a manner that, as shown in FIG. 20, a diffusion region overlaps with a gate electrode. More specifically, the diffusion region is constructed by a high-concentration impurity region 298 having high concentration of impurity which gives conductivity and a low-concentration impurity region 299 having low concentration of impurity. The high-concentration impurity region 298 is disposed so as to be offset from the gate electrode. The low-concentration impurity region 299 is in contact with and integrated with the high-concentration impurity region 298 to thereby form the diffusion region and is disposed so as to overlap with the gate electrode. Therefore, different from the memory cell shown in FIG. 8 of the second embodiment, the diffusion region overlaps with the gate electrode. Description of the reference numerals commonly used in FIGS. 8 and 20 will not be repeated.

Figure 21:
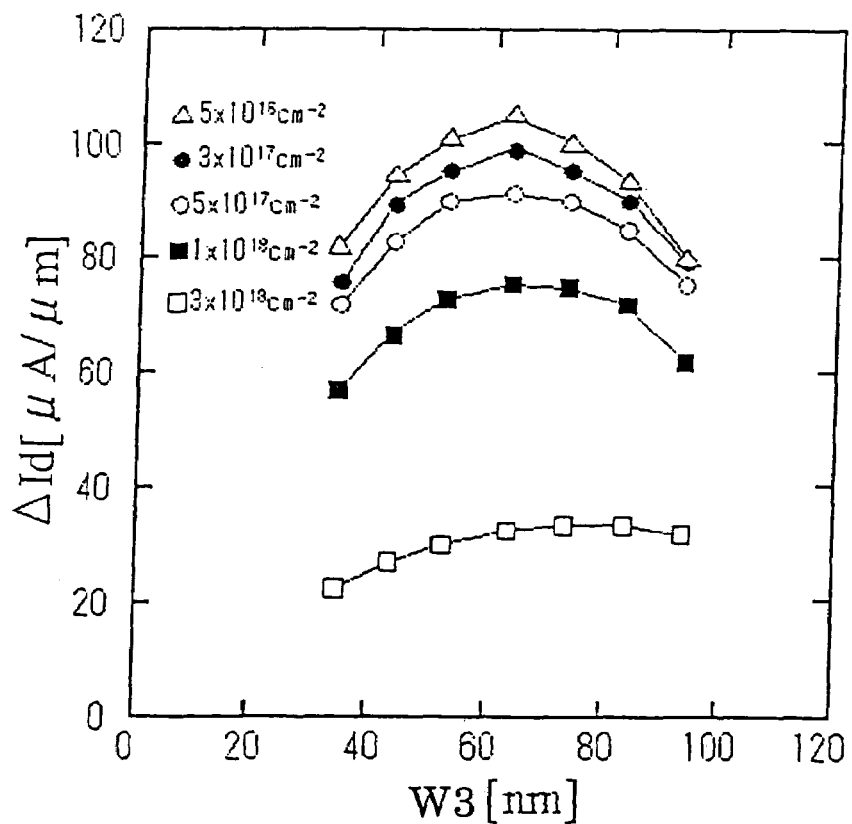
FIG. 21 is a diagram showing a simulation result of a memory effect of the memory cell having the structure of FIG. 20.

An effect obtained by the overlap between the diffusion region and the gate electrode will be described with reference to FIGS. 21 and 22. FIG. 21 shows a memory effect of the memory cell having the structure of FIG. 20, and FIG. 22 shows a memory effect of the memory cell having the structure of FIG. 8, each of which is calculated by device simulation.

In FIG. 21, the horizontal axis denotes the distance between an end of the gate electrode 217 and the high-concentration impurity region 298 (expressed as W3 in FIG. 20), and the vertical axis denotes the difference between the drain current at the time of writing and the drain current at the time of erasing. The drain current difference is a current difference detected when information stored in the memory cell is read. It is therefore preferable for the reason that the larger the drain current difference is, the more the reading speed can be increased. In FIG. 21, the drain current difference is plotted with respect to the cases where the impurity concentration of the low-concentration impurity region 299 is from $5 \times 10^{16}$ cm$^{-3}$ to $3 \times 10^{18}$ cm$^{-3}$. The horizontal axis in FIG. 22 denotes the width W1 of the offset region 271 in FIG. 8. In FIG. 22, the drain current difference is plotted with respect to the cases where the impurity concentration of the offset region 271 is from $4 \times 10^{16}$ cm$^{-3}$ to $1 \times 10^{18}$ cm$^{-3}$.

Figure 22:
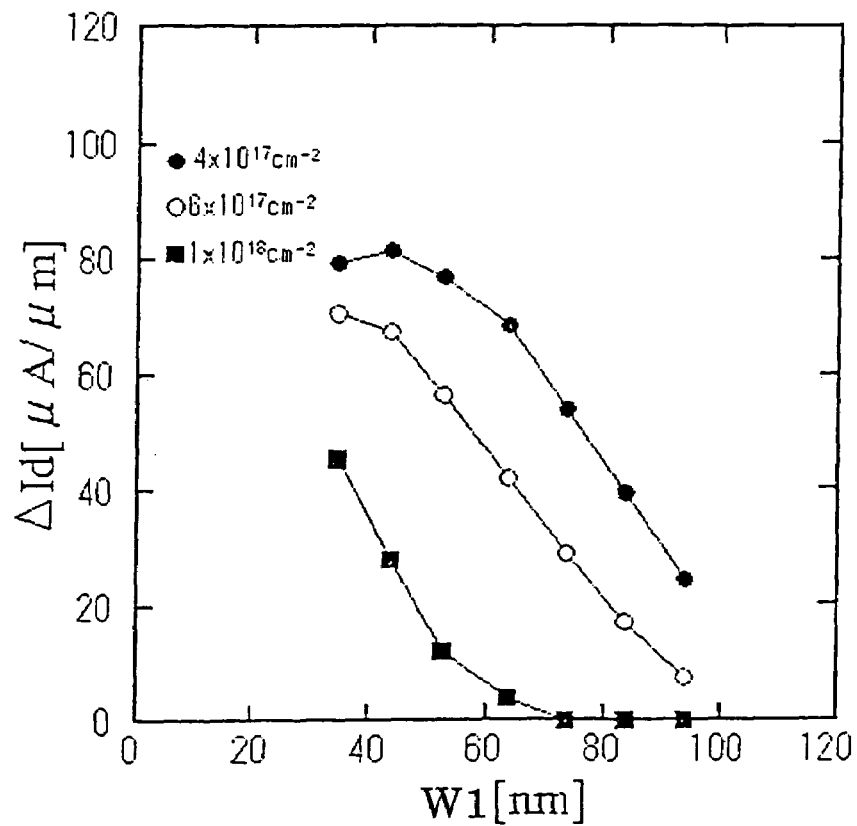
FIG. 22 is a diagram showing a simulation result of a memory effect of the memory cell having the structure of FIG. 8.

As obvious from comparison between FIGS. 21 and 22, the fluctuation amount of the drain current difference when W3 or W1 changes is smaller in the case where the diffusion region and the gate electrode overlap with each other. The diffusion regions 212 and 213 in FIG. 8 or the high-concentration impurity region 298 in FIG. 20 are usually formed by ion implantation using the memory functional unit as a mask. Therefore, W1 and W3 vary due to process dimension variations of the memory functional unit. The process variation of the memory functional unit is a serious problem as a cause of variation in the characteristics of the memory cell of the present invention. However, by overlapping the diffusion region and the gate electrode, the problem can be largely corrected. Therefore, by overlapping the diffusion region and the gate electrode, variations in the reading characteristic of the memory cell can be largely suppressed.

As understood from FIG. 21, the lower the impurity concentration of the low-concentration impurity region is, the larger the drain current difference becomes. It is preferable that the impurity concentration of the low-concentration impurity region is $1 \times 10^{18}$ cm$^{-3}$ or less since the drain current different becomes particularly large. On the other hand, in the case where the impurity concentration of the low-concentration impurity region is $1 \times 10^{15}$ cm$^{-3}$ or less, the impurity concentration variation due to impurity diffusion from the well region or the semiconductor substrate of the opposite conductive type becomes conspicuous, and it becomes difficult to stably form the low-concentration impurity region 299. Therefore, it is more preferable that the impurity concentration of the low-concentration impurity region is in the range from $1 \times 10^{15}$ cm$^{-3}$ to $1 \times 10^{18}$ cm$^{-3}$.

When electrons are accumulated in the memory functional units 261 and 262, the low-concentration impurity region 299 is depleted so that the drain current is reduced, and the memory effect appears. Therefore, the thickness (indicated as H1 in FIG. 20) of the low-concentration impurity region 299 is preferably set so that the low-concentration impurity region 299 is completely depleted for the reason that the drain current difference becomes large. In the case where the impurity concentration of the low-concentration impurity region 299 is $1 \times 10^{18}$ cm$^{-3}$, the thickness of a depletion layer is about 50 nm. Therefore, the thickness H1 of the low-concentration impurity region 299 is preferably 50 nm or less. On the other hand, when the thickness H1 of the low-concentration impurity region 299 is less than 1 nm, resistance of the low-concentration impurity region 299 itself becomes high, and the drain current remarkably decreases. Therefore, it is more preferable that the thickness H1 of the low-concentration impurity region 299 is in the range from 1 nm to 50 nm.

ELEVENTH EMBODIMENT

Figure 23:
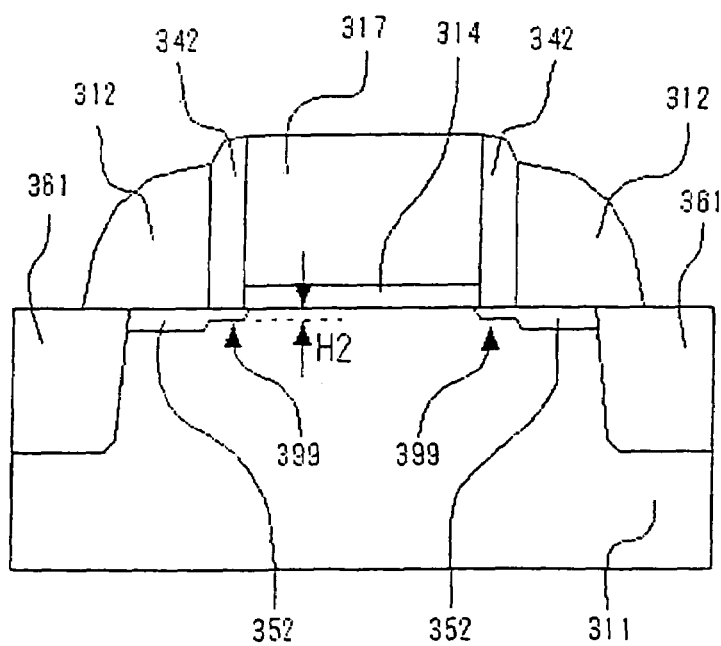
FIG. 23 is a schematic sectional view of a principal portion of a memory cell constituted a semiconductor memory device of an embodiment of the present invention (Eleventh Embodiment)

As shown in FIG. 23, a memory cell in a semiconductor memory device of an eleventh embodiment is different from the memory cell of the tenth embodiment with respect to the point that a part of a diffusion region exists at a level higher than the level of an interface between a gate insulating film and a semiconductor layer.

On a semiconductor substrate 311, a gate electrode 317 is formed via a gate insulating film 314. On both sidewalls of the gate electrode 317, memory functional units 342 made by a silicon nitride film are formed. The memory functional unit 342 may have a structure in which a silicon nitride film is sandwiched by silicon oxide films in a manner similar to the tenth embodiment (FIG. 20). Further, on the sidewalls of the memory functional unit 342, stacked diffusion layers 312 are formed. Under the stacked diffusion layer 312, a region 352 of the impurity leaked from the stacked diffusion layer 312 is formed and the thickness of the region 352 is reduced specially under the memory functional unit 342 (a region 399). The stacked diffusion layer 312 and the region 352 integrally construct a diffusion layer. A reference numeral 361 denotes a device isolation region.

By the configuration as in the memory cell shown in FIG. 23 in which a part of the diffusion region exists at a level higher than the level of the interface between the gate insulating film and the semiconductor layer, even in the case where the thickness of the region 352 of the impurity leaked from the stacked diffusion layer 312, which is formed in the semiconductor substrate is thin, the resistance in the diffusion region can be maintained to be low. In the case of the memory cell shown in FIG. 20, in order to maintain the resistance in the diffusion region to be low, the high-concentration impurity region 298 has to be provided. When the part of the diffusion region exists at a level higher than the level of the interface between the gate insulating film and the semiconductor layer, while maintaining resistance of the diffusion region to be low, it becomes easier to reduce the thickness of the diffusion region under the memory functional unit and to increase the memory effect.

For a reason similar to that of the memory cell (FIG. 20) of the tenth embodiment, the impurity concentration of the diffusion region (region 399) under the memory functional unit is preferably set to the range from $1 \times 10^{15}$ cm$^{-3}$ to $1 \times 10^{18}$ cm$^{-3}$ because the drain current difference becomes large.

For a reason similar to that of the memory cell (FIG. 20) of the tenth embodiment, the thickness (indicated as H2 in FIG. 23) of the diffusion region (region 399) under the memory functional unit is preferably in the range from 1 nm to 50 nm because the drain current difference becomes large.

FIGS. 24A to 24D illustrate a procedure for forming a memory cell of the eleventh embodiment. In FIGS. 24A to 24D, the case of forming a plurality of memory cells so as to be arranged will be described.

Figure 24A:
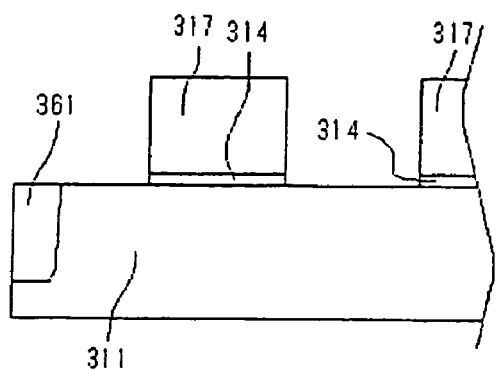
FIGS. 24A to 24D are views for illustrating a procedure for forming a memory cell constituted a semiconductor memory device of the present invention (Eleventh Embodiment)

First, as shown in FIG. 24A, by a known procedure, a device isolation region 361, a gate insulating film 314 and a gate electrode 317 are formed on a semiconductor substrate 311.

Figure 24B:
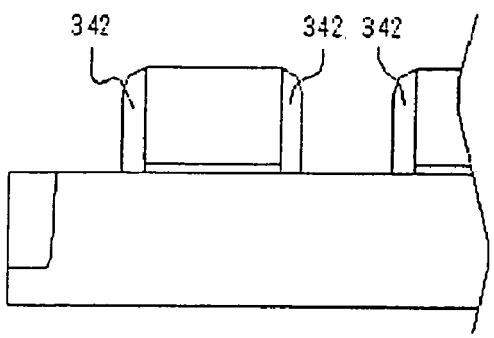

Next, as shown in FIG. 24B, memory functional units 342 are formed on sidewalls of the gate electrode 317. The memory functional units 342 can be formed by, for example, depositing a silicon nitride film to a thickness of 5 nm to 50 nm on the entire face of the substrate and, then, etch back the film.

Figure 24C:
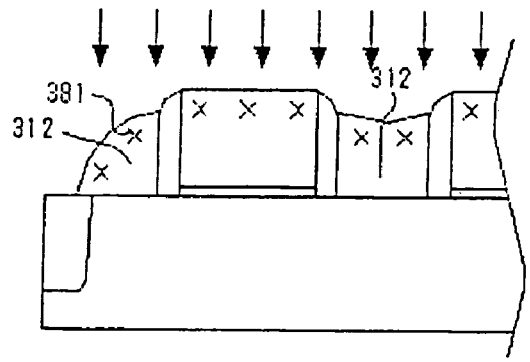

As shown in FIG. 24C, stacked diffusion layers 312 are formed on sidewalls of the memory functional units 342. The stacked diffusion layer 312 can be formed by depositing, for example, polycrystalline silicon to a thickness of 20 nm to 200 nm on the entire face of the substrate and, then, etch back the polycrystalline silicon. After that, for example, $^{31}P^+$ (phosphorus ions) are implanted. Preferably, phosphorus atoms (indicated as 381 in FIG. 24C) are implanted under the condition that they do not reach the semiconductor substrate 311 as much as possible. In this case, it is sufficient to set 5 to 50 KeV as implantation energy and set $1\times10^{15}$ cm$^{-2}$ to $1\times10^{16}$ cm$^{-2}$ as dosage.

Figure 24D:
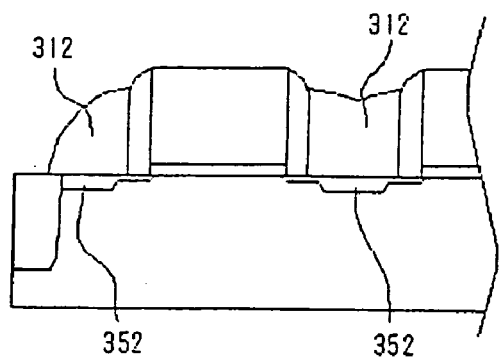

As shown in FIG. 24D, the impurity is leaked from the stacked diffusion layer 312 when heat treatment is performed, thereby forming the regions 352. The stacked diffusion layer 312 and the region 352 are integrated as a diffusion region.

After that, an upper wiring and the like are formed by a known method, thereby completing a semiconductor device.

The stacked diffusion layer 312 is preferably made of a polycrystalline semiconductor or an amorphous semiconductor. In the polycrystalline semiconductor and the amorphous semiconductor, diffusion speed of the impurity is much faster than that in a bulk crystal. At the time of heat treatment, consequently, the impurity diffuses quickly in the stacked diffusion layer whereas the impurity diffuses slowly in the semiconductor substrate. The impurity diffuses relatively fast around the interface between the memory functional unit 342 and the semiconductor substrate 311 and reaches the gate end. Therefore, by making the stacked diffusion layer 312 of the polycrystalline semiconductor or amorphous semiconductor, a thin diffusion region can be easily formed under the memory functional unit 342.

TWELFTH EMBODIMENT

Figure 25:
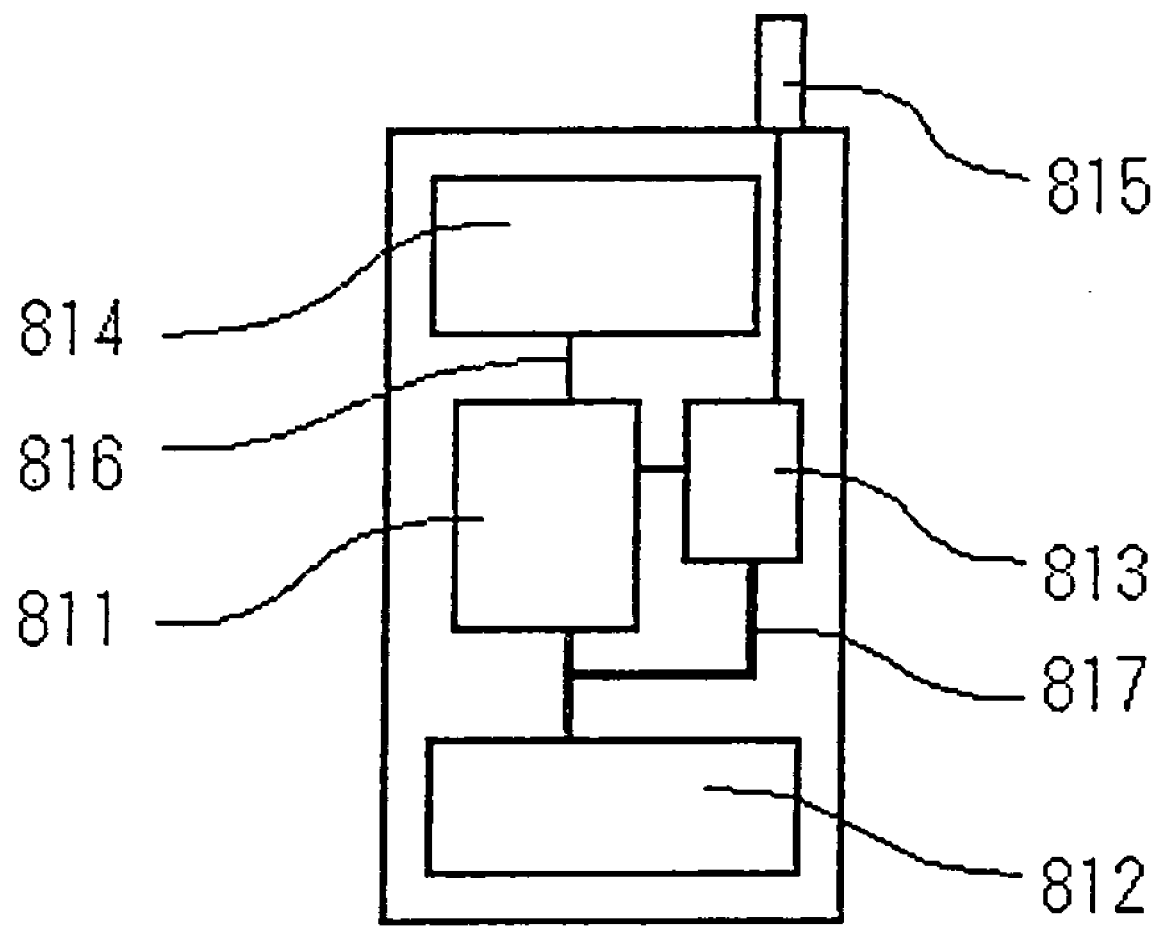
FIG. 25 is a schematic block diagram of a portable electronic apparatus assembled a semiconductor memory device of an embodiment of the present invention (Twelfth Embodiment)
Figure 26:
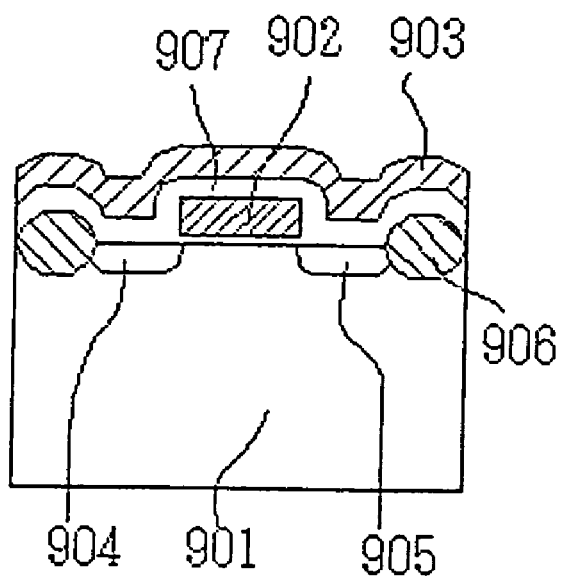
FIG. 26 is a schematic sectional view of a principal portion of a flash memory of the prior art.

FIG. 25 shows a portable telephone as a portable electronic apparatus in which the semiconductor memory device is assembled.

The portable telephone is constructed mainly by a control circuit 811, a battery 812, an RF (Radio Frequency) circuit 813, a display 814, an antenna 815, a signal line 816, a power source line 817 and the like. In the control circuit 811, the above-described semiconductor memory device or semiconductor device is assembled. By using the semiconductor memory device capable of storing two bits per one transistor and of which size reduction is easy for the portable electronic apparatus, the functions of the portable electronic apparatus and the operation speed are improved, and the manufacturing cost can be reduced.

As should be understood from the above, the semiconductor memory device according to the first aspect is made operate as a memory cell by converting a change in the amount of charges in the memory functional unit into a current amount. Since the two memory functional units formed on both sides of the gate electrode are independent of the gate insulating film, a memory function of the memory functional unit and a transistor operation function of the gate insulating film are separated from each other. Consequently, it is easy to reduce the thickness of the gate insulating film and suppress the short channel effect while maintaining the sufficient memory function. Since the two memory functional units formed on both sides of the gate electrode are separated from each other by the gate electrode, interference which occurs at the time of rewriting can be effectively suppressed. In other words, the distance between the two memory functional units can be made shorter. Therefore, a semiconductor memory device which can perform an operation of retaining information of two or more bits per one transistor and of which size is easily reduced can be realized.

Further, each of the diffusion regions is constructed by the high-concentration impurity region and the low-concentration impurity region, and the low-concentration impurity region overlaps with the gate electrode. Therefore, variations in the reading characteristic of the memory cells can be largely suppressed.

By setting the impurity concentration of the low-concentration impurity region to a range from $1\times10^{15}$ cm$^{-3}$ to $1\times10^{18}$ cm$^{-3}$, while stably forming the low-concentration impurity region, the difference between the drain current at the time of writing and the drain current at the time of erasing can be made larger.

By setting the thickness of the low-concentration impurity region to a range from 1 nm to 50 nm, while preventing resistance of the diffusion region from remarkably increasing and the drain current from decreasing, the difference between the drain current at the time of writing and the drain current at the time of erasing can be made larger.

The semiconductor memory device according to the second aspect also exhibits actions and effects similar to those of the semiconductor memory device according to the first aspect.

Further, since a part of the diffusion region exists at a level higher than the level of the interface between the gate insulating film and the semiconductor layer, while maintaining the resistance of the diffusion region to be low, the thickness of the diffusion region under the memory functional unit can be reduced. Thus, the memory effect can be easily increased.

When the part existing at the level higher than the level of the interface between the gate insulating film and the semiconductor layer of the diffusion region is made of a polycrystalline semiconductor or an amorphous semiconductor, a thin diffusion region can be easily formed under the memory functional unit. Therefore, the memory cell of a high memory effect can be easily formed.

By setting the impurity concentration in the diffusion region under the memory functional unit to the range from $1\times10^{15}$ cm$^{-3}$ to $1\times10^{18}$ cm$^{-3}$, while stably forming the part under the memory functional unit in the diffusion region, the difference between the drain current at the time of writing and the drain current at the time of erasing can be made larger.

By setting the thickness of the diffusion region under the memory functional unit to a range from 1 nm to 50 nm, while preventing resistance of the diffusion region from remarkably increasing and preventing the drain current from decreasing, the difference between the drain current at the time of writing and the drain current at the time of erasing can be made larger.

The memory functional unit has a film having the function of retaining charges, and the surface of the film having the function of retaining charges is arranged substantially parallel to the surface of the gate insulating film, thereby enabling variations in the memory effect of the memory cell to be reduced. Consequently, read current variations of the memory cell can be suppressed. Further, a characteristic change in the memory cell which is retaining information can be reduced, so that the information retention characteristic of the memory cell can be improved.

Alternatively, the film having the function of retaining charges is arranged substantially parallel to a side face of the gate electrode, thereby enabling the rewriting speed of the memory cell to increase. Therefore, the rewriting operation of the memory cell can be performed at higher speed.

Alternately, the memory functional unit may have an insulating film separating a film having the function of retaining charges and the channel region or the semiconductor layer from each other, and the insulating film may be thinner than the gate insulating film and have a thickness of 0.8 nm or more. With the configuration, the voltage in the writing operation and the erasing operation of a memory cell can be decreased or the writing operation and the erasing operation can be performed at higher speed. Since the memory effect of the memory cell increases, the reading speed of the memory part can be increased.

When the memory functional unit may have an insulating film separating a film having the function of retaining charges and the channel region or the semiconductor layer from each other, and the insulating film may be thicker than the gate insulating film and have a thickness of 20 nm or less, the retention characteristic can be improved without deteriorating the short channel effect of the memory cell. Consequently, even when memory cells are mounted at high packing density, a sufficient information retention characteristic can be obtained.

In a portable electronic apparatus including the semiconductor memory device according to the first or second aspect, functions and operating speed are improved and manufacturing cost can be reduced.

What is claimed is:

1. The A semiconductor memory device comprising:
a single gate electrode formed on a semiconductor layer via a gate insulating film;
a channel region disposed under the gate electrode;
first and second diffusion regions disposed on first and second sides of the channel region and having a conductive type opposite to that of the channel region; and
memory functional units formed on the semiconductor layer adjacent to the gate insulating film on both sidewalls of the gate electrode and having the function of retaining charges, wherein
each of the diffusion regions has:
a high-concentration impurity region overlapping one of the memory functional units in a gate length direction and disposed so as to be offset from the gate electrode in the gate length direction; and
a low-concentration impurity region having a first end disposed in contact with the high-concentration impurity region and a second end contacting the gate insulating film under the gate electrode, and
an amount of current flowing from the first diffusion region to the second diffusion region is changed when a voltage is applied to the gate electrode in accordance with an amount of charges retained in the memory functional units;
wherein the memory functional unit has an insulating film separating a film having the function of retaining charges and the channel region or the semiconductor layer from each other, and the insulating film is thinner than the gate insulating film and has a thickness of 0.8 nm or more.

2. The semiconductor memory device according to claim 1 wherein the impurity concentration of the low-concentration impurity region is in the range from $1 \times 10^{15}$ cm$^{-3}$ to $1 \times 10^{18}$ cm$^{-3}$.

3. The semiconductor memory device according to claim 1 wherein the thickness of the low-concentration impurity region is in the range from 1 nm to 50 nm.

4. The semiconductor memory device according to claim 1 wherein the memory functional unit has a film having the function of retaining charges, and a surface of the film having the function of retaining charges is arranged substantially parallel to a surface of the gate insulating film.

5. The semiconductor memory device according to claim 4 wherein the film having the function of retaining charges is arranged substantially parallel to a side face of the gate electrode.

6. A portable electronic apparatus in which the semiconductor memory device according to claim 1 is incorporated.

7. A semiconductor memory device comprising:
a single gate electrode formed on a semiconductor layer via a gate insulating film;
a channel region disposed under the gate electrode;
first and second diffusion regions disposed on first and second sides of the channel region and having a conductive type opposite to that of the channel region; and
memory functional units formed on the semiconductor layer adjacent to the gate insulating film on both sidewalls of the gate electrode and having the function of retaining charges, wherein
each of the diffusion regions has:
a high-concentration impurity region overlapping one of the memory functional units in a gate length direction and disposed so as to be offset from the gate electrode in the gate length direction; and
a low-concentration impurity region having a first end disposed in contact with the high-concentration impurity region and a second end contacting the gate insulating film under the gate electrode, and
an amount of current flowing from the first diffusion region to the second diffusion region is changed when a voltage is applied to the gate electrode in accordance with an amount of charges retained in the memory functional units;
wherein the memory functional unit has an insulating film separating a film having the function of retaining charges and the channel region or the semiconductor layer from each other, and the insulating film is thicker than the gate insulating film and has a thickness of 20 nm or less.

8. A semiconductor memory device including:
a gate electrode formed on a semiconductor layer via a gate insulating film;
a channel region disposed under the gate electrode;
first and second diffusion regions disposed on both sides of the channel region and having a conductive type opposite to that of the channel region; and
first and second memory functional units formed on both sidewalls of the gate electrode and having the function of retaining charges, wherein
a first part of the first diffusion region has a first thickness and a second part of the first diffusion region has a second thickness less than the first thickness,
the first part of the first diffusion region overlaps with the gate electrode in the gate length direction, and an amount of current flowing from the first diffusion region to the second diffusion region when a voltage is applied to the gate electrode is changed in accordance with an amount of charges retained in the memory functional units;

wherein the memory functional unit has an insulating film separating a film having the function of retaining charges and the channel region or the semiconductor layer from each other, and the insulating film is thinner than the gate insulating film and has a thickness of 0.8 nm or more.

9. The semiconductor memory device according to claim 8 wherein the first part of the first diffusion region is made of a polycrystalline semiconductor or an amorphous semiconductor.

10. The semiconductor memory device according to claim 8 wherein the second part of the first diffusion region comprises a low-concentration impurity region and wherein the impurity concentration of the low-concentration impurity region is in the range from $1\times10^{15}$ cm$^{-3}$ to $1\times10^{18}$ cm$^{-3}$.

11. The semiconductor memory device according to claim 8 wherein the second part of the first diffusion region comprises a low-concentration impurity region and wherein the thickness of the low-concentration impurity region is in the range from 1 nm to 50 nm.

12. The semiconductor memory device according to claim 8 wherein the memory functional unit has a film having the function of retaining charges, and a surface of the film having the function of retaining charges is arranged substantially parallel to a surface of the gate insulating film.

13. The semiconductor memory device according to claim 12 wherein the film having the function of retaining charges is arranged substantially parallel to a side face of the gate electrode.

14. A portable electronic apparatus in which the semiconductor memory device according to claim 8 is incorporated.

15. A semiconductor memory device including:

a gate electrode formed on a semiconductor layer via a gate insulating film;

a channel region disposed under the gate electrode;

first and second diffusion regions disposed on both sides of the channel region and having a conductive type opposite to that of the channel region; and first and second memory functional units formed on both sidewalls of the gate electrode and having the function of retaining charges, wherein a first part of the first diffusion region has a first thickness and a second part of the first diffusion region has a second thickness less than the first thickness, the first part of the first diffusion region overlaps with the gate electrode in the gate length direction, and an amount of current flowing from the first diffusion region to the second diffusion region when a voltage is applied to the gate electrode is changed in accordance with an amount of charges retained in the memory functional units;

wherein the memory functional unit has an insulating film separating a film having the function of retaining charges and the channel region or the semiconductor layer from each other, and the insulating film is thicker than the gate insulating film and has a thickness of 20 nm or less.

* * * * *